US012230501B2

United States Patent
Kodama et al.

(10) Patent No.: US 12,230,501 B2
(45) Date of Patent: Feb. 18, 2025

(54) SEMICONDUCTOR DEVICE AND METHOD OF MANUFACTURING SEMICONDUCTOR DEVICE

(71) Applicant: FUJI ELECTRIC CO., LTD., Kawasaki (JP)

(72) Inventors: Naoko Kodama, Matsumoto (JP); Motoyoshi Kubouchi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 570 days.

(21) Appl. No.: 17/463,164

(22) Filed: Aug. 31, 2021

(65) Prior Publication Data
US 2021/0398812 A1   Dec. 23, 2021

Related U.S. Application Data

(63) Continuation of application No. PCT/JP2020/030634, filed on Aug. 11, 2020.

(30) Foreign Application Priority Data

Sep. 5, 2019   (JP) .................................. 2019-162397

(51) Int. Cl.
*H01L 21/266* (2006.01)
*H01L 21/263* (2006.01)
(Continued)

(52) U.S. Cl.
CPC .......... *H01L 21/266* (2013.01); *H01L 21/263* (2013.01); *H01L 21/26513* (2013.01); *H01L 29/66348* (2013.01); *H01L 29/7397* (2013.01)

(58) Field of Classification Search
CPC ................. H01L 21/266; H01L 21/263; H01L 21/26513; H01L 29/66348; H01L 29/7397
(Continued)

(56) References Cited

U.S. PATENT DOCUMENTS

2010/0270585 A1* 10/2010 Rahimo ............... H01L 29/1095
  438/135
2016/0329323 A1* 11/2016 Iwasaki ............... H01L 27/0727
(Continued)

FOREIGN PATENT DOCUMENTS

| CN | 109314134 A | 2/2019 |
|---|---|---|
| JP | 2002118117 A | 4/2002 |

(Continued)

OTHER PUBLICATIONS

International Search Report. Issued on Nov. 2, 2020 in corresponding International Application No. PCT/JP2020/030634.
(Continued)

*Primary Examiner* — Dzung Tran
(74) *Attorney, Agent, or Firm* — Rabin & Berdo, P.C.

(57) ABSTRACT

A method of manufacturing a semiconductor device, including preparing a semiconductor substrate having a main surface, forming a device element structure on the main surface, forming a protective film on the main surface of the semiconductor substrate to protect the device element structure, the protective film having an opening therein, forming at least one material film in a predetermined pattern on the main surface of the semiconductor substrate and in the opening of the protective film, the at least one material film being separate from the protective film by a distance of less than 1 mm, forming a resist film on the main surface of the semiconductor substrate, covering the protective film and the at least one material film, the resist film having an opening therein corresponding to an inducing region for impurity defects, and inducing the impurity defects in the semiconductor substrate, using the resist film as a mask.

9 Claims, 16 Drawing Sheets

(51) Int. Cl.
*H01L 21/265* (2006.01)
*H01L 29/66* (2006.01)
*H01L 29/739* (2006.01)

(58) Field of Classification Search
USPC .......................................................... 257/140
See application file for complete search history.

(56) References Cited

U.S. PATENT DOCUMENTS

| 2017/0133227 | A1 | | 5/2017 | Kajiwara |
| 2018/0269063 | A1 | | 9/2018 | Kodama |
| 2018/0374919 | A1 | * | 12/2018 | Tilke ................... H01L 29/0634 |
| 2019/0096989 | A1 | | 3/2019 | Yoshida |
| 2019/0139772 | A1 | * | 5/2019 | Kodama ............. H01L 29/7395 |

FOREIGN PATENT DOCUMENTS

| JP | 2008112872 A | 5/2008 |
| JP | 2017092256 A | 5/2017 |
| JP | 2018157017 A | 10/2018 |
| WO | 2018105299 A1 | 6/2018 |
| WO | 2018110703 A1 | 6/2018 |

OTHER PUBLICATIONS

Written Opinion of the International Searching Authority. Issued on Nov. 2, 2020 in corresponding International Application No. PCT/JP2020/030634.
Chinese Office Action dated Dec. 29, 2023, in the counterpart Chinese Patent Application No. 202080018058.2.

\* cited by examiner

SEMICONDUCTOR DEVICE AND METHOD OF MANUFACTURING SEMICONDUCTOR DEVICE

CROSS REFERENCE TO RELATED APPLICATIONS

This is a continuation application of International Application PCT/JP2020/030634 filed on Aug. 11, 2020 which claims priority from a Japanese Patent Application No. 2019-162397 filed on Sep. 5, 2019, the contents of which are incorporated herein by reference.

BACKGROUND OF THE INVENTION

1. Field of the Invention

Embodiments of the invention relate to semiconductor device and a method of manufacturing a semiconductor device.

2. Description of the Related Art

Conventionally, power devices have been developed for which characteristics are enhanced and improved by inducing impurity defects that become carrier lifetime killers, said impurity defects being induced in a semiconductor substrate by ion implantation using a high acceleration energy having a range at a deep position from a surface of the semiconductor substrate. A structure of a conventional semiconductor device in which impurity defects that become carrier lifetime killers have been induced is described. FIGS. 12 and 13 are plan views depicting examples of layouts when the conventional semiconductor device is viewed from a front surface of a semiconductor substrate. FIGS. 14 and 15 are cross-sectional views of examples of the structure along cutting line AA-AA' in FIG. 12.

For example, in a reverse-conducting IGBT (RC-IGBT) having a structure in which an insulated gate bipolar transistor (IGBT) and a freewheeling diode (FWD) connected in antiparallel to the IGBT are built into a single semiconductor substrate (semiconductor chip) 110, impurity defects 114 that become carrier lifetime killers are induced in an n$^-$-type drift region 101 by helium (He) irradiation (refer to FIG. 14).

In particular, a conventional semiconductor device 140 depicted in FIGS. 12 and 13 includes IGBT regions 131 that are operating regions of the IGBT and FWD regions 132 that are operating region of the FWD, in an active region 141 of the semiconductor substrate 110. The IGBT regions 131 and the FWD regions 132 are disposed repeatedly alternating one another in a first direction X parallel to a front surface (main surface having an n$^+$-type emitter region 103) of the semiconductor substrate 110. The IGBT regions 131 and the FWD regions 132 are disposed in a striped pattern extending in a second direction Y that is parallel to the front surface of the semiconductor substrate 110 and orthogonal to the first direction X. An edge termination region 142 surrounds a periphery of the active region 141.

The front surface of the semiconductor substrate 110 is covered by a polyimide film (hereinafter, polyimide protective film) 121 that is a passivation protective film. An opening 121a exposing an entire area of the active region 141 is formed in the polyimide protective film 121 and the polyimide protective film 121 is left covering the front surface of the semiconductor substrate 110 in the edge termination region 142 (FIG. 12). Polyimide protective films 122, 123 constituting passivation protective films may be left in the opening 121a of the polyimide protective film 121 so as to cover a p-type well region directly beneath a gate wiring layer (not depicted) disposed in the active region 141 and directly beneath a cathode wiring layer (not depicted) of a temperature sensing diode (FIG. 13). Directly beneath the polyimide protective films 122, 123 are the IGBT regions 131.

In the FWD regions 132, the impurity defects 114 are induced by helium irradiation in the n$^-$-type drift region 101, near borders between the n$^-$-type drift region 101 and n-type carrier storage regions 104. In the FWD regions 132, the impurity defects 114 are induced in the n$^-$-type drift region 101, whereby the carrier lifetime of minority carriers in the FWD regions 132 is shortened, thereby shortening reverse recovery time of the FWD. When the helium irradiation is performed from an entire area of the surface of the semiconductor substrate 110, the impurity defects 114 are induced in an entire area of the semiconductor substrate 110 and therefore, the impurity defects 114 are further induced in the IGBT regions 131 (FIG. 14).

In an instance in which the impurity defects 114 are induced in the IGBT regions 131, it has been confirmed that conduction loss and leak current of the IGBT increases. Therefore, a method of inducing the impurity defects 114 in only the FWD regions 132 by blocking the helium irradiation to the IGBT regions 131 has been proposed (FIG. 15). In this instance, for example, the impurity defects 114 are induced in an entire area of the FWD regions 132 so as to extend to portions of the IGBT regions 131 facing the FWD regions 132 (hereinafter, overlap regions) 133. The impurity defects 114, may be hydrogen ion defects induced by hydrogen ion (H$^+$) irradiation.

In FIGS. 12 and 13, in an intermediate region between the active region 141 and the edge termination region 142, an outline of a p$^+$-type well region 116 provided in the semiconductor substrate 110 at the front surface of the semiconductor substrate 110, surrounding the periphery of the active region 141 is indicated by a broken line. Borders between low carrier lifetime regions 134 induced with the impurity defects 114 by helium irradiation, shortening the carrier lifetime therein and regions free of the impurity defects 114 are indicated by coarser broken lines than that indicating the outline of the p$^+$-type well region 116. The passivation protective films (the polyimide protective films 121 to 123) are indicated by hatching outlined by thick lines.

Reference numerals 102, 108, 109, 111, 113, and 115 are p-type base regions of the IGBT of the IGBT regions 131, an interlayer insulating film, an emitter electrode, p$^+$-type collector regions, an n-type field stop region, and a collector electrode, respectively. Reference numeral 112 is n$^+$-type cathode regions of a FWD of the FWD regions 132. The p-type base regions 102, an emitter electrode 109, and the collector electrode 115 are further disposed in the FWD regions 132 and respectively serve as p-type anode regions, an anode electrode, and a cathode electrode of the FWD. Trench gate structures including trenches 105, gate insulating films 106, and gate electrodes 107 are further disposed in the FWD regions 132.

A method of inducing the impurity defects 114 is described taking an instance in which the impurity defects 114 are induced by helium irradiation as an example. FIGS. 16 and 17 are cross-sectional views depicting states of the conventional semiconductor device during manufacture. As depicted in FIG. 16, in an instance in which a helium irradiation 152 is performed from a back surface (main surface having the p$^+$-type collector regions 111) of a semiconductor wafer 110', the helium irradiation 152 by a high acceleration energy is performed so that an amount of the impurity defects 114 is greatest (defect peak) at a deep position from the back surface of the semiconductor wafer 110' and therefore, a metal mask 151 having a high shielding capability is used as a shielding film.

In particular, after element device structures of the IGBT and the FWD are formed in the semiconductor wafer 110', the metal mask 151 is fixed to the semiconductor wafer 110' by, for example, a clip or screw (not depicted), etc. so as to face the back surface of the semiconductor wafer 110'. The helium irradiation 152 is performed from the back surface of the semiconductor wafer 110', using the metal mask 151 as a mask, whereby from an opening 151a of the metal mask 151, in the overlap regions 133 of the IGBT regions 131 and in the FWD regions 132, the impurity defects 114 are induced at a position shallower from the back surface of the semiconductor wafer 110' than are bottoms of the trenches 105.

The metal mask 151 is mechanically processed by a cutting process, wire cut processing, etc. and therefore, positioning accuracy and processing accuracy of the opening 151a degrades. Further, alignment precision of the metal mask 151 with the semiconductor wafer 110' is about a few tens of μm and therefore, compared to a resist film 161 (refer to FIG. 17) that is formed by photolithography and can be aligned at a submicron level, accurate positioning degrades. As depicted in FIG. 17, in an instance in which a helium irradiation 162 is performed from a front surface of the semiconductor wafer 110', the resist film 161, which is more advantageous than the metal mask 151 for processing accuracy and accurate positioning, may be used as a shielding film.

In particular, after the device element structures of the IGBT and the FWD are formed in the semiconductor wafer 110', on the front surface of the semiconductor wafer 110', the resist film 161 having an opening 161a exposing the overlap regions 133 of the IGBT regions 131 and in the FWD regions 132 is formed. The helium irradiation 162 is performed through an emitter electrode 109 using the resist film 161 as a mask (shielding film), whereby in the overlap regions 133 of the IGBT regions 131 and in the FWD regions 132, the impurity defects 114 are induced at a position deeper from the front surface of the semiconductor wafer 110' than are the bottoms of the trenches 105.

As a method of selectively implanting an impurity using a resist film as a shielding film, a method of forming a resist film having a thickness of at least 220 μm enabling use as a shielding film during helium irradiation has been proposed, the resist film being formed by controlling a number of rotations of a semiconductor wafer during resist application using a spin coating method and during edge removal of the resist film after drying (for example, refer to International Publication No. WO 2018/105299). In International Publication No. WO 2018/105299, a high viscosity resist is used and/or resist application is performed at least two times, whereby the resist film is assured to have a predetermined thickness. Further, International Publication No. WO 2018/105299 discloses that either a positive resist or a negative resist is applicable.

Further, as another method of selectively implanting an impurity using a resist film as a shielding film, a method of preventing impurity implantation in a region in which impurity implantation is unnecessary has been proposed, the impurity implantation being prevented by determining a thickness of the resist film based on a range of the implanted impurity in the semiconductor substrate (for example, refer to Japanese Laid-Open Patent Publication No. 2017-092256). Japanese Laid-Open Patent Publication No. 2017-092256 discloses use of a negative photosensitive dry film as a thick resist film that can be used fora shielding film. Further, Japanese Laid-Open Patent Publication No. 2017-092256 discloses formation of the resist film having a predetermined thickness at a predetermined position by discharging the resist by an ink jet method.

SUMMARY OF THE INVENTION

According to an embodiment of the invention, a method of manufacturing a semiconductor device, includes preparing a semiconductor substrate having a main surface, and forming a predetermined device element structure on the main surface; forming a protective film on the main surface of the semiconductor substrate, the protective film protecting the predetermined device element structure; forming a predetermined pattern of at least one material film in an opening of the protective film on the main surface of the semiconductor substrate, separate from the protective film by a predetermined distance of less than 1 mm, forming a resist film having an opening corresponding to an inducing region for impurity defects, the resist film being formed on the main surface of the semiconductor substrate, covering the protective film and the material films; and inducing the impurity defects in the semiconductor substrate, using the resist film as a mask.

Objects, features, and advantages of the present invention are specifically set forth in or will become apparent from the following detailed description of the invention when read in conjunction with the accompanying drawings.

DETAILED DESCRIPTION OF THE INVENTION

Figure 17:
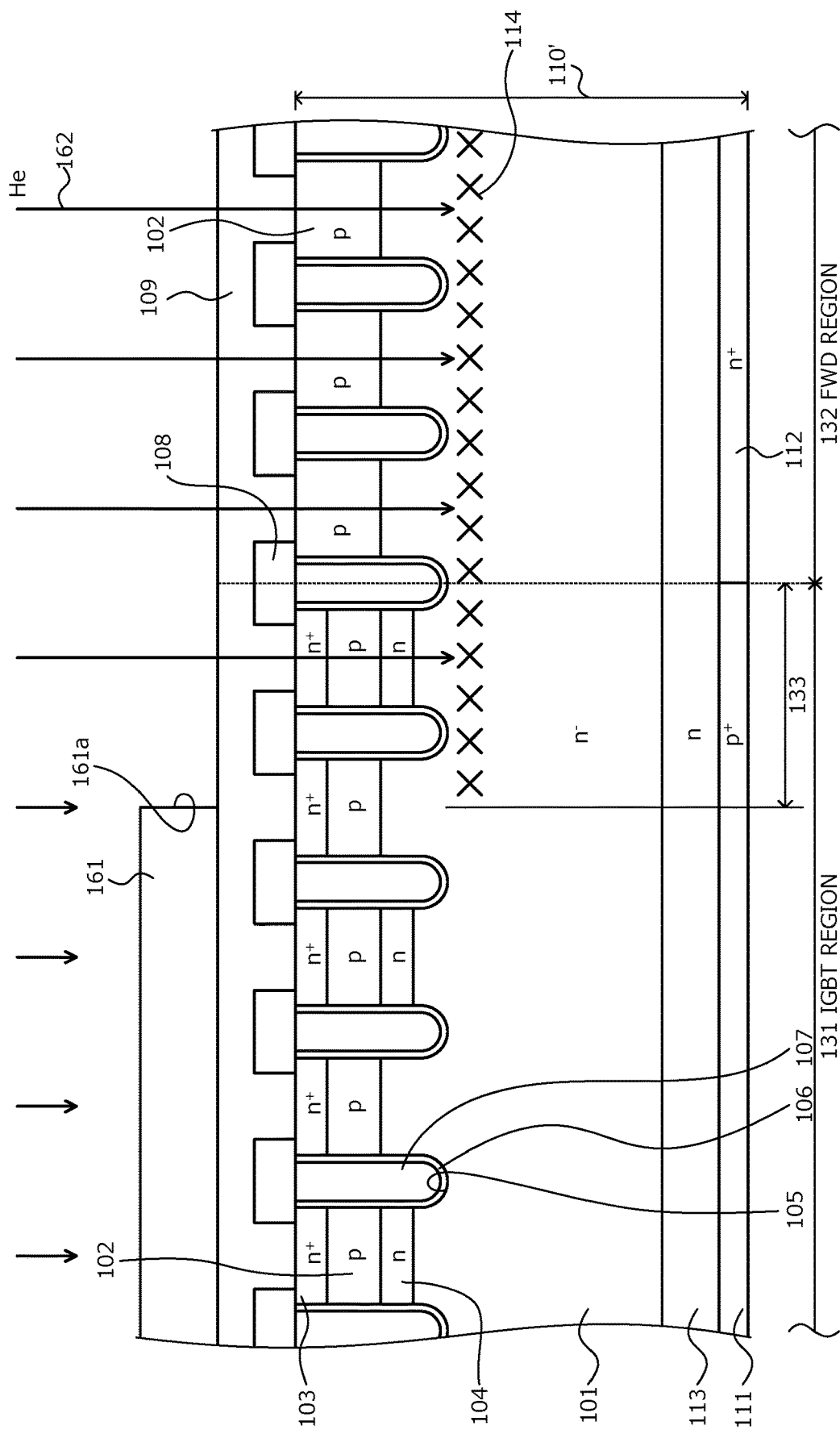
FIG. 17 is a cross-sectional view depicting a state of the conventional semiconductor device during manufacture.

First, problems associated with the conventional technique are discussed. As described above, in an instance in which the helium irradiation 162 is performed from the front surface of the semiconductor wafer 110', the resist film 161 may be used as a shielding film (refer to FIG. 17). In an instance in which the resist film 161 is formed on the front surface of the semiconductor wafer 110', resist is applied on steps formed at the front surface of the semiconductor wafer 110' due to front surface device element structures already formed (hereinafter, steps of the front surface of the semiconductor wafer 110'). At this time, due to the steps of the front surface of the semiconductor wafer 110', the thickness of the resist film 161 may not be uniform.

Figure 11:
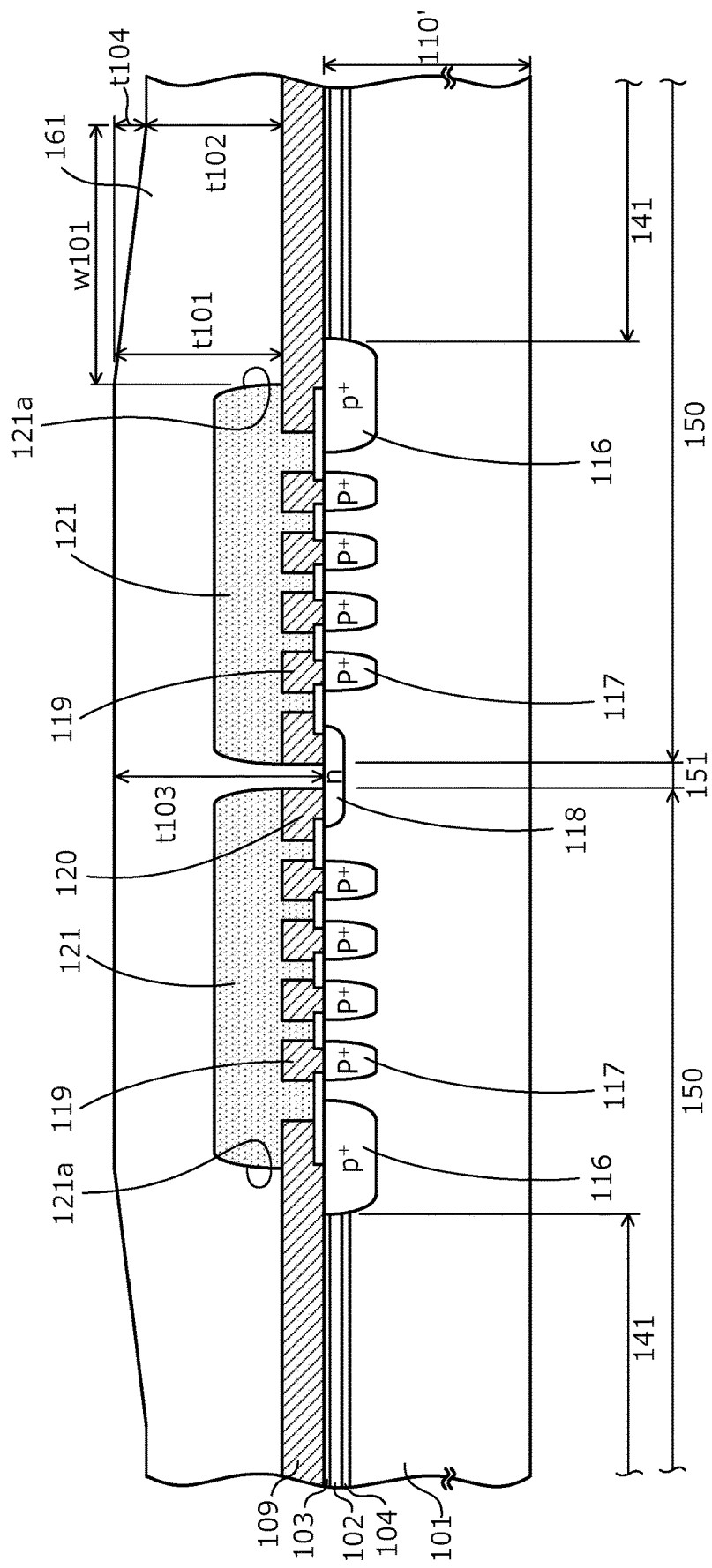
FIG. 11 is a cross-sectional view depicting a state of a conventional semiconductor device during manufacture.
Figure 12:
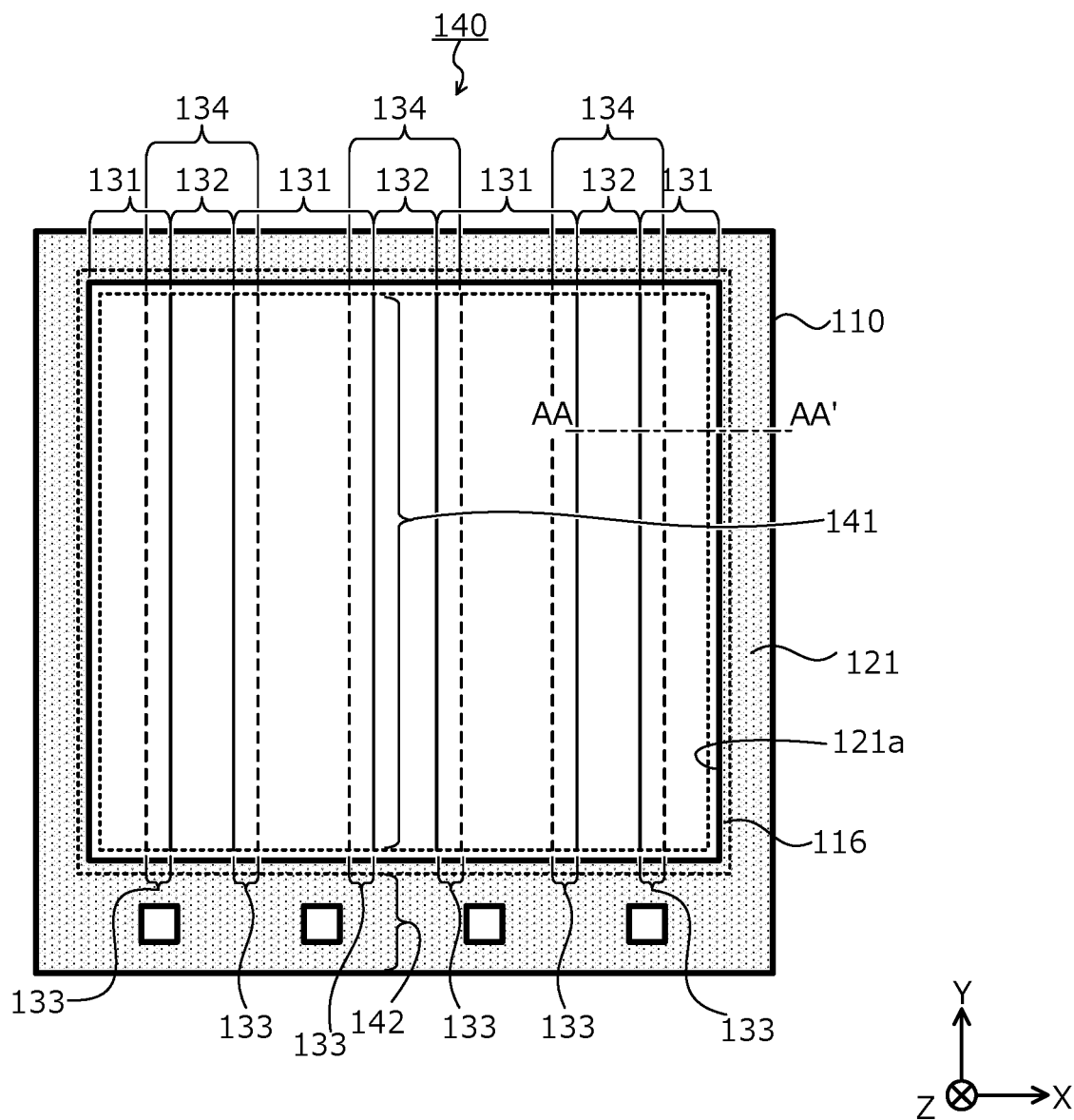
FIG. 12 is a plan view depicting an example of a layout when the conventional semiconductor device is viewed from a front surface of a semiconductor substrate.
Figure 13:
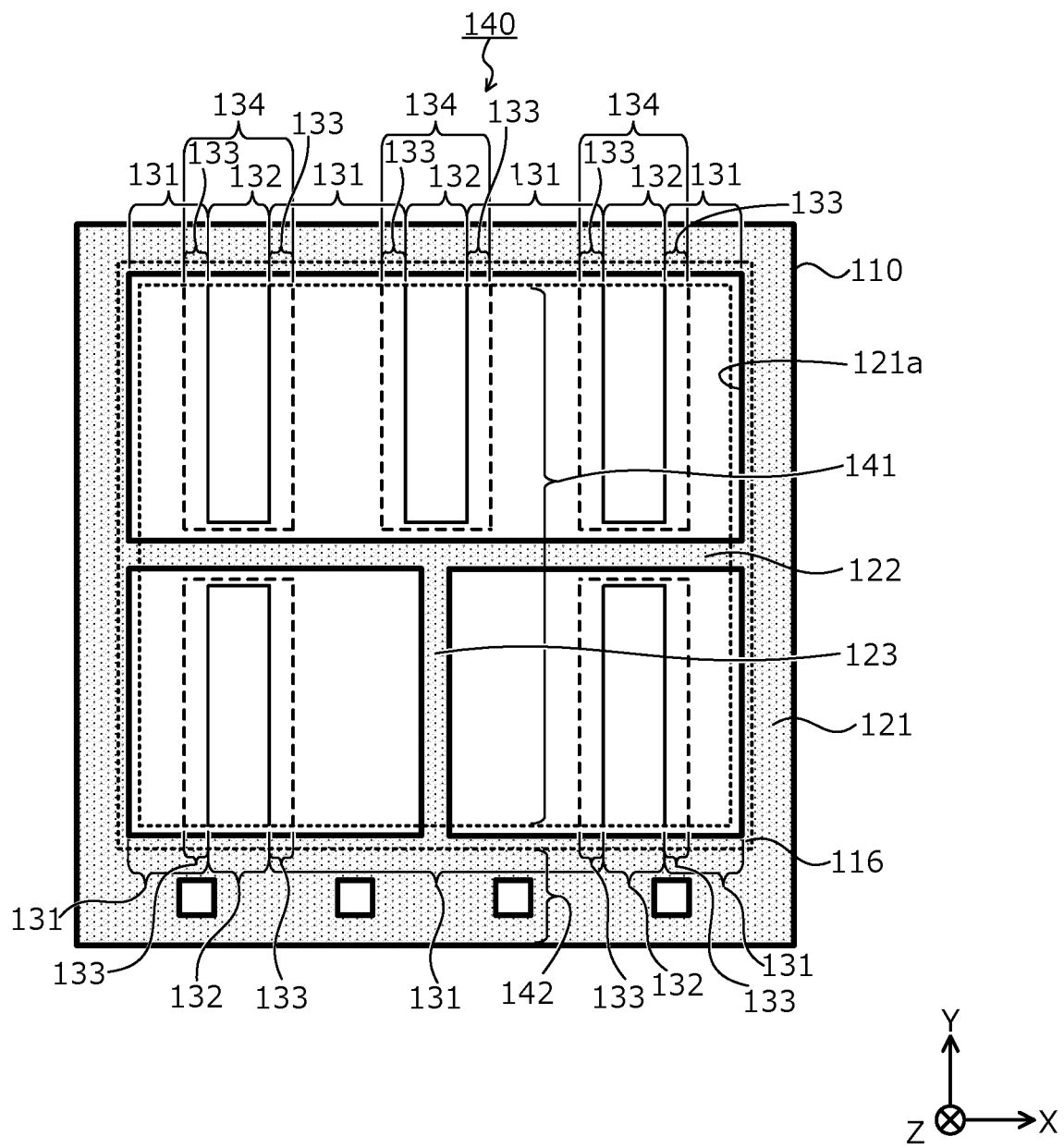
FIG. 13 is a plan view depicting an example of a layout when the conventional semiconductor device is viewed from the front surface of the semiconductor substrate.
Figure 14:
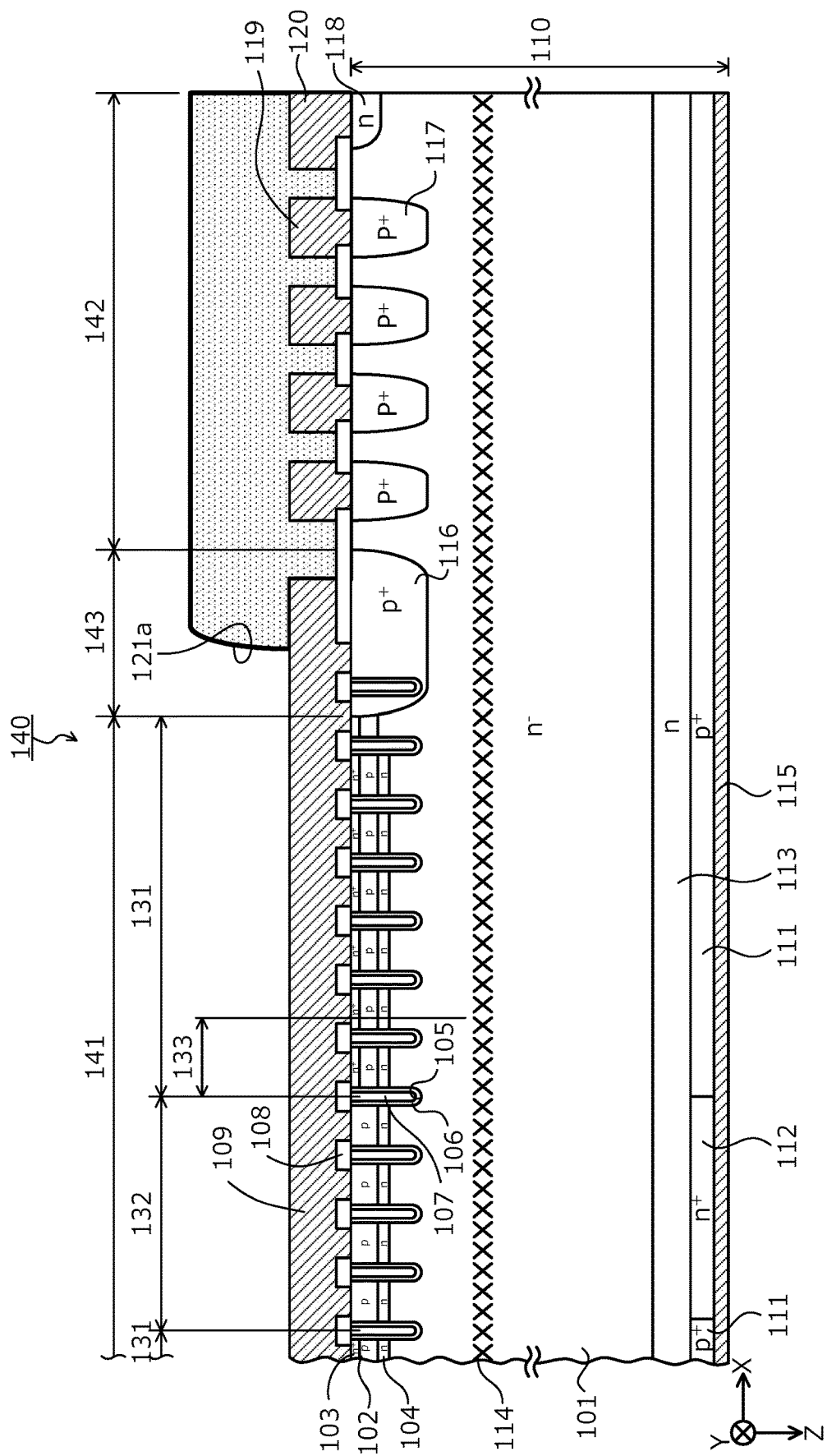
FIG. 14 is a cross-sectional view of an example a structure along cutting line AA-AA' in FIG. 12.
Figure 15:
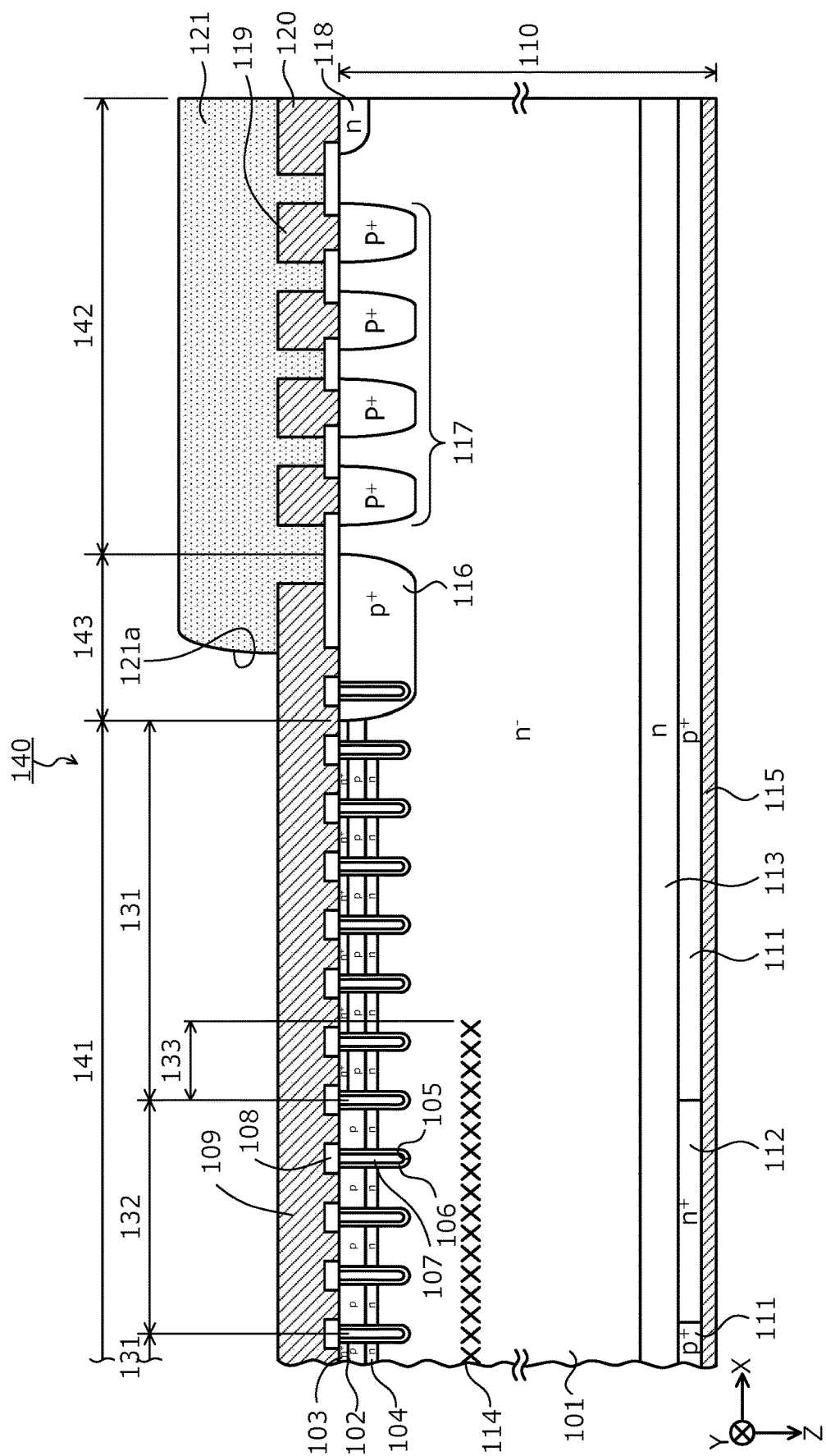
FIG. 15 is a cross-sectional view of an example of the structure along cutting line AA-AA' in FIG. 12.
Figure 16:
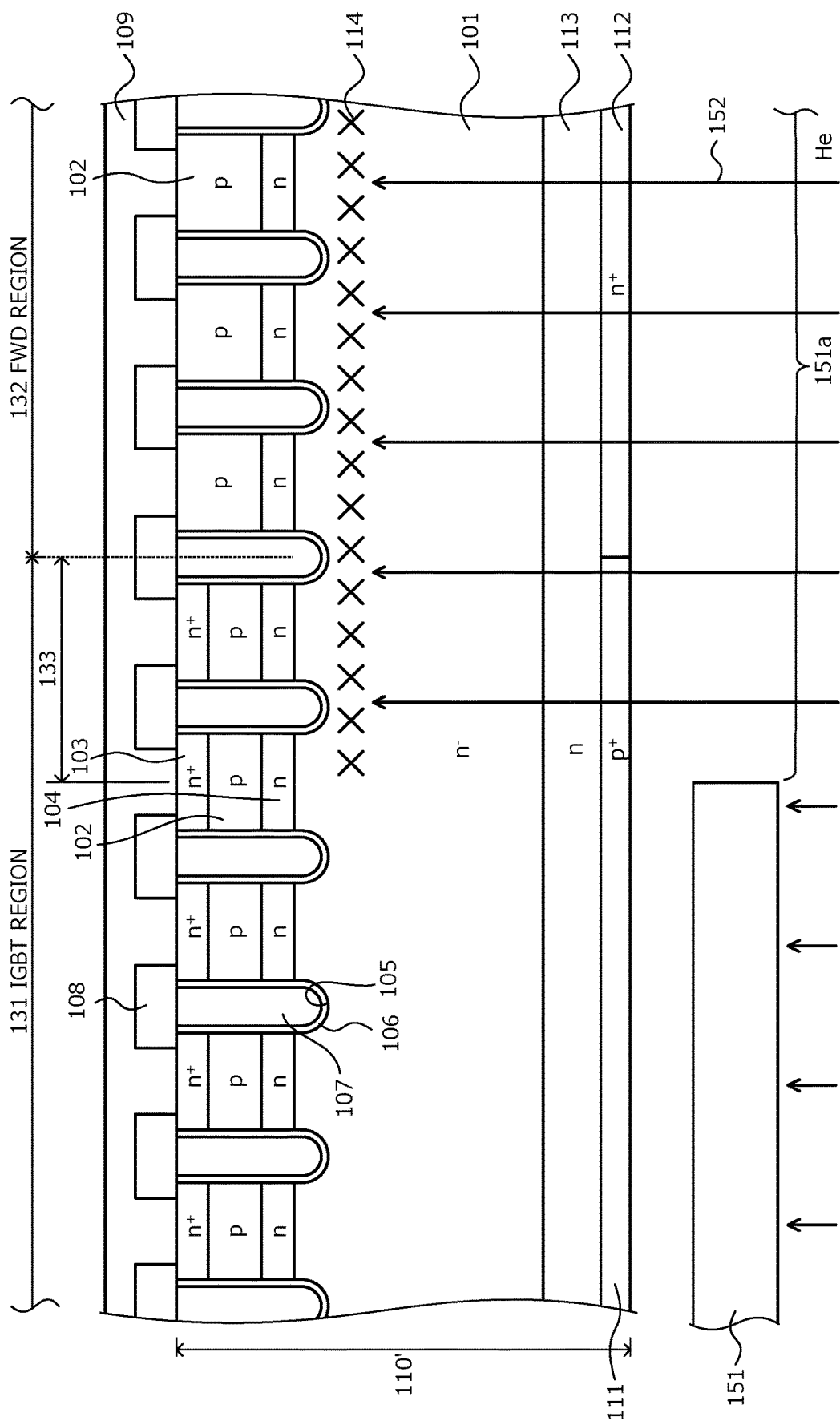
FIG. 16 is a cross-sectional view depicting a state of the conventional semiconductor device during manufacture.

The steps of the front surface of the semiconductor wafer 110' are steps occurring due to differences in a height of the surface of the polyimide protective film 121 and a height of the surface of the emitter electrode 109 exposed in the opening 121a of the polyimide protective film 121. A state in which the thickness of the resist film 161 formed on the front surface of the semiconductor wafer 110' is not uniform is depicted in FIG. 11. FIG. 11 is a cross-sectional view depicting a state of the conventional semiconductor device during manufacture. In FIG. 11, trench gate structures of the front surface device element structures formed on a front side of the semiconductor wafer 110' and device element structures on a back side of the semiconductor wafer 110' are not depicted.

In particular, as depicted in FIG. 11, in general, the resist film 161, on the front surface of the semiconductor wafer 110', near portions higher than other portions such as the polyimide protective film 121, has thicknesses t101, t103 that tend to be thick and at a portion separate from the high portions, has a thickness t102 that tends to be thin. In an instance in which the resist film 161 has a portion where the thickness t102 is thin, during the helium irradiation 162, helium (or hydrogen ions by hydrogen ion irradiation) are introduced into portions other than the overlap regions 133 of the IGBT regions 131, the portions that should be shielded.

In an instance in which helium or hydrogen ion are introduced into portions other than the overlap regions 133 of the IGBT regions 131, increases in leak current, increases in conduction loss, and decreases in gate threshold voltage occur in the IGBT regions 131 and thus, lead to degradation of IGBT characteristics. To solve these problems, the thickness of an entire area of the resist film 161 suffices to increased so that the portion of the resist film 16 where the thickness t102 is thin is increased in thickness to an extent enabling use as a shielding film during the helium irradiation 162.

Nonetheless, to further increase the thickness of an entire area of the resist film 161, design changes such as changing the resist material, increasing the amount of resist used, etc. are necessary. Increasing the amount of resist used includes applying the resist so that the resist film constituting the resist film 161 includes two stacked layers. Measures for increasing the thicknesses of the resist film 161, in general, lead to increases in cost and thus, are problematic.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
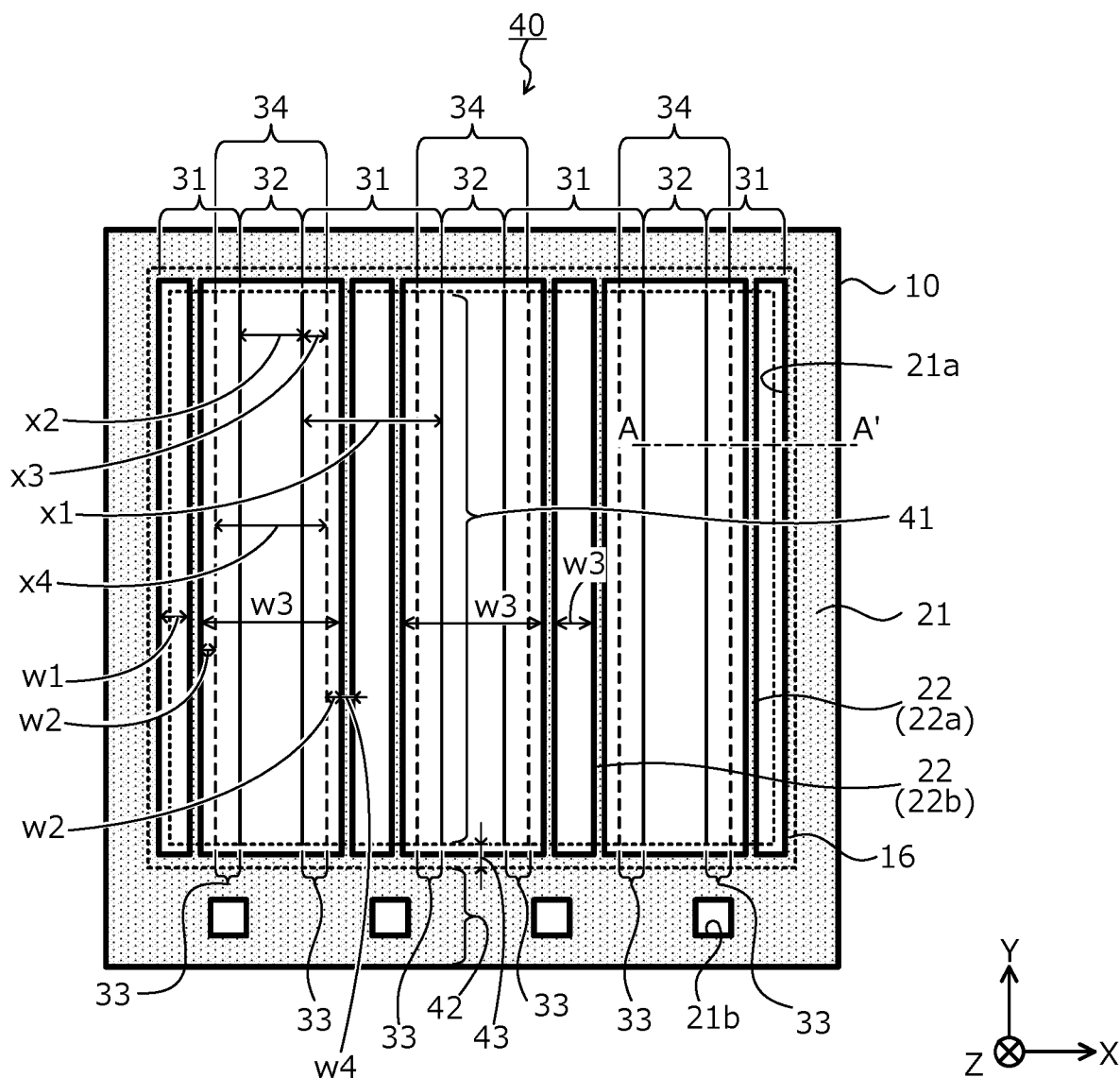
FIG. 1 is a plan view depicting a state when a semiconductor device according to a first embodiment is viewed from a front surface of a semiconductor substrate.

A structure of a semiconductor device according to a first embodiment is described. FIG. 1 is a plan view depicting a state when the semiconductor device according to the first embodiment is viewed from a front surface of a semiconductor substrate. A semiconductor device 40 according to the first embodiment depicted in FIG. 1 includes IGBT regions (first regions) 31 constituting IGBT operating regions and FWD regions (second regions) 32 constituting FWD operating regions, in an active region 41 of a semiconductor substrate (semiconductor chip) 10, the semiconductor device 40 being an RC-IGBT in which impurity defects 14 (indicated by "×" in FIG. 2) constituting carrier lifetime killers are induced in the FWD regions 32 by helium (He) irradiation.

The IGBT regions 31 and the FWD regions 32 are disposed repeatedly alternating one another in the first direction X that is parallel to a front surface of the semiconductor substrate 10 (main surface having later-described $n^-$-type emitter regions 3, refer to FIG. 2). The IGBT regions 31 and the FWD regions 32 are disposed in a striped pattern extending in the second direction Y that is parallel to the front surface of the semiconductor substrate 10 and orthogonal to the first direction X. In the active region 41, one of the IGBT regions 31 is disposed at each outermost end of the active region 41 (ends closest to chip ends) in the first direction X.

The impurity defects 14 (refer to FIG. 2) are induced in the semiconductor substrate 10, in all later-described overlap regions 33 of the IGBT regions 31 and in all of the FWD regions 32. The impurity defects 14 are induced, whereby the carrier lifetime of minority carriers of the FWD regions 32 is shortened and FWD reverse recovery time may be shortened. The impurity defects 14 may be helium (He) defects induced by helium irradiation or may be hydrogen ion defects induced by hydrogen ion ($H^+$) irradiation.

In each of the IGBT regions 31, portions (overlap regions) 33 having a predetermined width x3 in the first direction X, from borders thereof with the FWD regions 32 adjacent thereto are non-operating regions that do not operate as an IGBT. The overlap regions 33 reduce the IGBT characteristics and therefore, when the impurity defects 14 are induced in the FWD regions 32, the impurity defects 14 are intentionally induced in the overlap regions 33 as well. The IGBT regions 31 include the overlap regions 33 and are regions operating as an IGBT. In the present embodiment, while an instance in which the overlap regions 33 are present is described, the overlap regions 33 may be omitted or regions free of the impurity defects 14 may be present facing the FWD regions 32.

The semiconductor substrate 10, for example, has a rectangular shape in a plan view thereof. A width (chip size) of the semiconductor substrate 10 is such that one edge is, for example, in a range from about 4 mm to 20 mm. A width x1 of each of the IGBT regions 31 in the first direction X is, for example, about 1200 µm. A width x2 of each of the FWD regions 32 in the first direction X is, for example, about 600 µm. The active region 41 has, for example, a rectangular shape in a plan view thereof. The active region 41 is a region through which current flows when the IGBT is in an ON state. A periphery of the active region 41 is surrounded by an edge termination region 42.

The edge termination region 42 is a region between the active region 41 and ends (chip ends) of the semiconductor substrate 10 and is a region for mitigating electric field of a front side of the semiconductor substrate 10 and sustaining a breakdown voltage (withstand voltage). The breakdown voltage is a voltage limit at which leak current does not increase excessively and at which no destruction or erroneous operation of a device element occurs. Voltage withstanding structures such as field limiting rings (FLRs) 17 and field plates (FPs) 19 are disposed in the edge termination region 42 (refer to FIG. 2).

The front surface of the semiconductor substrate 10 is covered by a polyimide film (polyimide protective film) 21 constituting a passivation protective film. In the polyimide protective film 21, an opening 21a exposing an entire area of the active region 41 and one or more openings 21b selectively exposing the edge termination region 42 are formed. In the opening 21a exposing an entire area of the active region 41, a front electrode 9 (refer to FIG. 2) is exposed. A portion of the front electrode 9 exposed in the opening 21a of the polyimide protective film 21 functions as a front electrode pad that pulls out potential of the front electrode 9.

In the one or more openings 21b (in FIG. 1, four (4) are depicted) selectively exposing the edge termination region 42, an electrode pad other than the front electrode pad is exposed. An electrode pad other than the front electrode pad includes, for example, a gate pad electrically connected to gate electrodes 7 (refer to FIG. 2) of the IGBTs disposed in the IGBT regions 31, an electrode pad for current sensing to detect, for example, overcurrent (OC) such as surges passing through the IGBT, an electrode pad of a temperature sensing portion that detects temperature, using temperature characteristics of a diode, etc.

The polyimide protective film 21, covers the front surface of the semiconductor substrate 10 in the edge termination region 42 and surrounds the active region 41 in a substantially rectangular shape. In other words, the polyimide protective film 21 has the openings 21a, 21b in portions thereof where the electrode pads are formed, and covers and protects regions that are free of the electrode pads. An inner peripheral side of the polyimide protective film 21 (side facing a chip center) may extend to an intermediate region 43 between the active region 41 and the edge termination region 42, a position of the inner peripheral side of the polyimide protective film 21 being determined by design conditions. The intermediate region 43 may be exposed in the opening 21a of the polyimide protective film 21.

In the opening 21a of the polyimide protective film 21, in the IGBT regions 31, a dummy polyimide film (hereinafter, dummy pattern polyimide films (material films)) 22 that do not function as a passivation protective film are selectively provided in portions other than the later-described overlap regions 33. The dummy pattern polyimide films 22 are disposed to form a resist film 52 (refer to FIGS. 3 and 4) having a substantially uniform thickness and used as a shielding film during a later-described helium irradiation performed for inducing the impurity defects 14 in the semiconductor substrate 10, the dummy pattern polyimide films 22 remaining as is in a product (the semiconductor device 40).

The dummy pattern polyimide films 22 are disposed so that a distance w1 to the polyimide protective film 21, a distance w2 from the overlap regions 33, and a distance w3 between the dummy pattern polyimide films 22 adjacent to each other are in later-described ranges. A dummy pattern of the dummy pattern polyimide films 22 is disposed with the distances w1 to w3, whereby during fabrication (manufacture) of the semiconductor device 40, the resist film 52 covering the polyimide protective film 21 and the dummy pattern polyimide films 22 may be formed having a substantially uniform thickness. A substantially uniform thickness means a substantially same thickness in a range including an allowable error due to process variation.

In particular, the dummy pattern polyimide films 22, for example, are provided parallel to one another in linear shapes extending in the second direction Y. The dummy pattern polyimide films 22 may extend in the second direction Y and may be connected to the polyimide protective film 21. In each outermost IGBT region 31 outermost in the first direction X of the IGBT regions 31, at least one of the dummy pattern polyimide films 22 is disposed. The dummy pattern polyimide films 22 disposed in the outermost IGBT regions 31 outermost in the first direction X are each a first polyimide film 22a disposed outermost of the dummy pattern polyimide films 22, in the first direction X.

The distance w1 between the first polyimide film 22a and a portion of the polyimide protective film 21 along an edge parallel to the second direction Y is, for example, less than about 1 mm. Further, in the IGBT regions 31, at least one of the dummy pattern polyimide films 22 is disposed so that conditions including the distance w2 from the later-described overlap regions 33 and the distance w3 between the dummy pattern polyimide films 22 adjacent to each other are satisfied. Of the dummy pattern polyimide films 22, second polyimide films 22b that exclude the first polyimide films 22a are disposed closer to the chip center than are the first polyimide films 22a.

The second polyimide films 22b are disposed between the overlap regions 33 and the first polyimide films 22a in the outermost IGBT regions 31 outermost in the first direction X, and in the IGBT regions 31 excluding the outermost IGBT regions 31 outermost in the first direction X. In the outermost IGBT regions 31 outermost in the first direction X, in an instance in which the distance (the later-described distance w2) from the first polyimide film 22a to the overlap regions 33 is less than 1 mm, the second polyimide films 22b may be omitted in the outermost IGBT regions 31 outermost in the first direction X.

The dummy pattern polyimide films 22 are disposed separate from the overlap regions 33 adjacent thereto. In particular, favorably, the dummy pattern polyimide films 22 may be apart from the adjacent overlap regions 33 by the distance w2, for example, in a range from about 20 µm to less than 1 mm. A lower limit of the distance w2 is a minimum distance (reference character w2' in FIG. 4) from an end of the resist film 52 to the dummy pattern polyimide films 22, necessary to completely cover the dummy pattern polyimide films 22 by the resist film 52 during fabrication of the semiconductor device 40. An upper limit of the distance w2 is an upper limit value to obtain an effect of the first embodiment. The distance w3 between the dummy pattern polyimide films 22 adjacent to one another is, for example, less than about 1 mm. In other words, the dummy pattern polyimide films 22 are disposed at intervals less than 1 mm.

A height h1 of the dummy pattern polyimide films 22 (refer to FIG. 2) is in a range from about at least half of a height of the polyimide protective film 21 to not more than about a height substantially a same as a height of the polyimide protective film 21. The lower is the height h1 of the dummy pattern polyimide films 22, the better is the spreading of resist during formation of the later-described resist film 52. The height h1 of the dummy pattern polyimide films 22 is set to be at most the height of the polyimide protective film 21, whereby the resist film 52 formed so as to cover the dummy pattern polyimide films 22 during fabrication of the semiconductor device 40 may be formed having a substantially uniform thickness. Further, the dummy pattern polyimide films 22 are disposed in linear shapes parallel to the front surface of the semiconductor substrate 10, thereby facilitating spreading of resist when the resist film 52 is formed.

A width w4 and the height h1 of the dummy pattern polyimide films 22 are equal to each other (the width w4:the height h1=1:1). The wider is the width w4 of the dummy pattern polyimide films 22, the greater is a strength of the dummy pattern polyimide films 22; however, the wider is the width w4 of the dummy pattern polyimide films 22, the greater is a surface area of the front electrode 9 covered by the dummy pattern polyimide films 22, thereby reducing heat dissipation of the semiconductor substrate 10. Therefore, preferably, the width w4 of the dummy pattern polyimide films 22 may be as narrow as possible in range ensuring the strength of the dummy pattern polyimide films 22.

Further, the dummy pattern polyimide films 22 are not disposed in wire bonding sites. Wiring is bonded to the surface of the front electrode 9 between the dummy pattern polyimide films 22. In an instance in which, for example, a wire (not depicted) of a diameter of 500 μm is bonded to the front electrode 9 between the dummy pattern polyimide films 22, while load due to a wire bonding tool is applied to the dummy pattern polyimide films 22, electrical characteristics of the semiconductor device 40 are not adversely affected. A shape of the bonding wire may be a linear shape or a ribbon-like shape.

The dummy pattern polyimide films 22 are not disposed in low carrier lifetime regions 34 in which the impurity defects 14 are induced. A reason for this is that the dummy pattern polyimide films 22 function as a shielding film during the helium irradiation for inducing the later-described impurity defects 14. Instead of the dummy pattern of the dummy pattern polyimide films 22, as described hereinafter, a dummy pattern of a material film using another material may be disposed. The dummy pattern of the dummy pattern polyimide films 22 may be disposed in a different layout in each of the IGBT regions 31.

In FIG. 1, an outline of the intermediate region 43 between the active region 41 and the edge termination region 42 is indicated by a broken line. Borders between the low carrier lifetime regions 34 in which the impurity defects 14 are induced and the carrier lifetime is shortened and regions free of the impurity defects 14 are indicated by a broken line finer than the broken line indicating the outline of the intermediate region 43. The regions of the IGBT regions 31 free of the impurity defects 14 are regions of the IGBT regions 31 excluding the overlap regions 33. The polyimide protective film 21 and the dummy pattern polyimide films 22 are indicated by hatching outlined by a thick line (similarly in FIGS. 6 to 10).

Next, a cross-section of the structure of the semiconductor device 40 according to the first embodiment is described. FIG. 2 is cross-sectional view of the structure along cutting line A-A' in FIG. 1. As depicted in FIG. 2, the semiconductor device 40 according to the first embodiment, as described above, includes the active region 41 and the edge termination region 42 on the semiconductor substrate (semiconductor chip) 10 and has the IGBT regions 31 and the FWD regions 32 in the active region 41. In the semiconductor substrate 10, an $n^-$-type drift region 1 extending from the active region 41 to the edge termination region 42 and reaching the ends of the semiconductor substrate 10 is provided.

In the active region 41, between the front surface of the semiconductor substrate 10 and the $n^-$-type drift region 1, p-type base regions 2 are provided. In the IGBT regions 31, between the front surface of the semiconductor substrate 10 and the p-type base regions 2, the $n^+$-type emitter regions 3 and $p^+$-type contact regions (not depicted) are selectively provided so as to be in contact with the p-type base regions 2 and to be exposed at the front surface of the semiconductor substrate 10. The $n^+$-type emitter regions 3 and the $p^+$-type contact regions, for example, are disposed in contact with one another, repeatedly alternating one another in the second direction Y.

Figure 2:
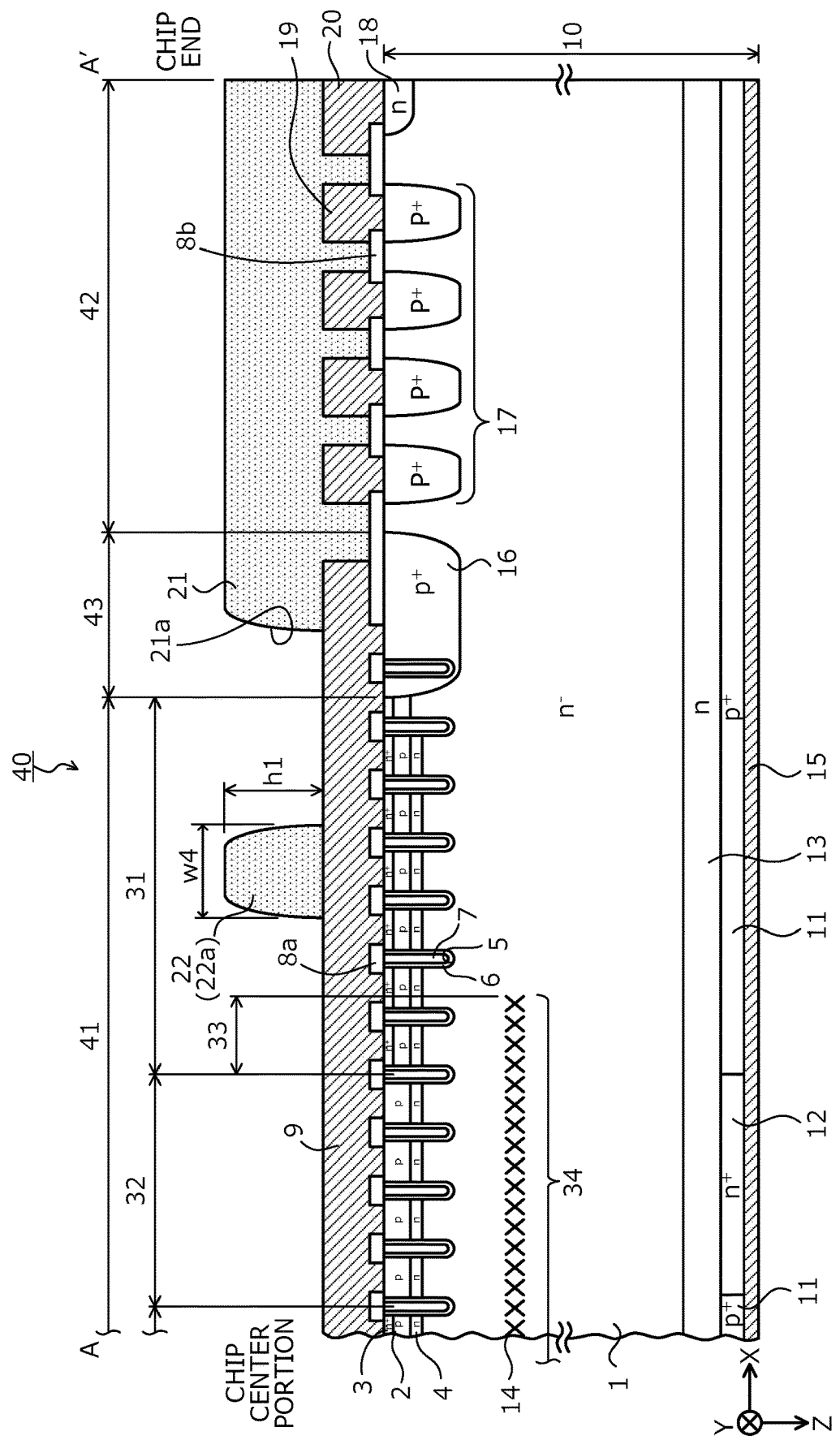
FIG. 2 is cross-sectional view of a structure along cutting line A-A' in FIG. 1.

FIG. 2 depicts a cross-section of the structure through the $n^+$-type emitter regions 3, along cutting line A-A' parallel to the first direction X, a cross-sectional view of the structure along a cutting line through the $p^+$-type contact regions and parallel to the first direction X is not depicted. The $p^+$-type contact regions may be omitted. In an instance in which the $p^+$-type contact regions are omitted, the $n^+$-type emitter regions 3 are disposed scattered in the second direction Y. Between the scattered $n^+$-type emitter regions 3 adjacent to one another in the second direction Y, the p-type base regions 2 are exposed at the front surface of the semiconductor substrate 10.

Between the $n^-$-type drift region 1 and the p-type base regions 2, n-type carrier storage (CS) regions 4 in contact with the $n^-$-type drift region 1 and the p-type base regions 2 may be provided. The n-type carrier storage regions 4 have a function of storing positive holes when the IGBT is in an ON state, reducing surface resistance of the front side of the semiconductor substrate 10, and reducing ON resistance of the IGBT. In an instance in which the n-type carrier storage regions 4 are omitted, the $n^-$-type drift region 1 and the p-type base regions 2 are in contact with each other.

Trenches 5 penetrate through the $n^+$-type emitter regions 3, the $p^+$-type contact regions, the p-type base regions 2, and the n-type carrier storage regions 4, and reach the $n^-$-type drift region 1. The trenches 5 extend in a striped pattern in the second direction Y, terminating in a later-described $p^+$-type well region 16. The trenches 5, as described hereinafter, are further provided in the FWD regions 32. Outermost trenches 5 outermost in the first direction X of the trenches 5 are disposed in the intermediate region 43. In the trenches 5, the gate electrodes 7 are provided via gate insulating films 6.

In the FWD regions 32, similarly to the IGBT regions 31, the p-type base regions 2, the n-type carrier storage regions 4, the trenches 5, the gate insulating films 6, and the gate electrodes 7 are provided. The p-type base regions 2 and the n-type carrier storage regions 4 extend from the IGBT regions 31 to the FWD regions 32. In the FWD regions 32, the p-type base regions 2 function as p-type anode regions. The trenches 5 are disposed parallel to the trenches 5 of the IGBT regions 31, at a same pitch as a pitch of the trenches 5 of the IGBT regions 31. The FWD regions 32 are free of the n+-type emitter regions 3.

Between a back surface of the semiconductor substrate 10 and the type drift region 1, p+-type collector regions 11, n+-type cathode regions 12, and an n-type field stop (FS) region 13 are provided. The p+-type collector regions 11 are disposed in the IGBT regions 31 and are exposed at the back surface of the semiconductor substrate 10. The p+-type collector regions 11 disposed in the outermost IGBT regions 31 outermost in the first direction X extend from the IGBT regions 31 to the edge termination region 42 and reach the ends of the semiconductor substrate 10.

The n+-type cathode regions 12 are disposed in the FWD regions 32 and are exposed at the surface of the semiconductor substrate 10. The n+-type cathode regions 12 are disposed parallel to the p+-type collector regions 11 and are in contact with the p+-type collector regions 11 in the first direction X. The n-type FS region 13 is in contact with the n−-type drift region 1, extends from the active region 41 to the edge termination region 42, and reaches the ends of the semiconductor substrate 10. The n-type FS region 13 has a function of suppressing the spreading of a depletion layer that spreads from junctions between the p-type base regions 2 and the n-type carrier storage regions 4 when the IGBT is OFF.

In the overlap regions 33 of the IGBT regions 31 and in the FWD regions 32, the impurity defects 14 are induced in the n−-type drift region 1, near a border between the n−-type drift region 1 and the n-type carrier storage regions 4. The impurity defects 14, for example, have an impurity concentration peak (maximum value) at a depth, for example, about 15 µm from the front surface of the semiconductor substrate 10 and a depth, for example, about 100 µm from the back surface of the semiconductor substrate 10. The overlap regions 33 of the IGBT regions 31 and the FWD regions 32 are the low carrier lifetime regions 34 in which the impurity defects 14 are induced and for which the carrier lifetime is shortened.

In an entire area of the intermediate region 43, between the front surface of the semiconductor substrate 10 and the n−-type drift region 1, the p+-type well region 16 is provided. A region on an inner peripheral side of the p+-type well region 16 is the active region 41 and a region between the p+-type well region 16 and the ends of the semiconductor substrate 10 is the edge termination region 42. The p+-type well region 16 is in contact with the n−-type drift region 1 and the p-type base regions 2, and is exposed at the front surface of the semiconductor substrate 10. The p+-type well region 16 reaches a position deeper from the front surface of the semiconductor substrate 10 than are the trenches 5, and entirely surrounds the outermost trenches 5 outermost in the first direction X of the trenches 5. The p+-type well region 16 surrounds the bottoms of the trenches 5 at the ends of the trenches 5 in the second direction Y.

In the edge termination region 42, between the front surface of the semiconductor substrate 10 and the n−-type drift region 1, field limiting rings (FLRs) 17 that are floating p-type regions separate from the p+-type well region 16 and closer to the chip ends than is the p+-type well region 16 are provided. Further, in the edge termination region 42, between the front surface of the semiconductor substrate 10 and the n−-type drift region 1, an n-type channel stopper region 18 separate from the FLRs 17 and closer to the chip ends than are the FLRs 17 is selectively provided.

The FLRs 17 and the n-type channel stopper region 18 are in contact with the n−-type drift region 1 and exposed at the front surface of the semiconductor substrate 10. The FLRs 17 surround a periphery of the p+-type well region 16 in a substantially rectangular concentric pattern (not depicted) in a plan view thereof. The n-type channel stopper region 18 is exposed at the ends of the semiconductor substrate 10. An interlayer insulating film 8a that covers the gate electrodes 7 is provided on the front surface of the semiconductor substrate 10 in the active region 41. A field oxide film 8b is provided on the front surface of the semiconductor substrate 10 in the edge termination region 42.

The front electrode 9 is in contact with and electrically connected to the n+-type emitter regions 3 and the p+-type contact regions, in the IGBT regions 31, via contact holes in the interlayer insulating film 8a. In an instance in which the IGBT regions 31 are free of the p+-type contact regions, the front electrode 9 is in contact with and electrically connected to the n+-type emitter regions 3 and the p-type base regions 2, in the IGBT regions 31. The front electrode 9 is electrically insulated from the gate electrodes 7 by the interlayer insulating film 8a.

The front electrode 9 is in contact with and electrically connected to the p-type base regions 2 (in an instance in which the p+-type contact regions are provided, the p-type base regions 2 and the p+-type contact regions), in the FWD regions 32, via contact holes in the interlayer insulating film 8a. The front electrode 9 further serves as an anode electrode. The front electrode 9 extends from the active region 41 to the intermediate region 43 and terminates on the p+-type well region 16. The front electrode 9 is in contact with and electrically connected to the p+-type well region 16 in the intermediate region 43, via a contact hole in the interlayer insulating film 8a.

The FPs 19 are disposed at positions facing the FLRs 17 in the depth direction Z, respectively, separate from the front electrode 9. The FPs 19 are in contact with and electrically connected to the FLRs 17 facing thereto in the depth direction Z, via contact holes in the field oxide film 8b. A channel stopper electrode 20 is disposed at a position facing the n-type channel stopper region 18 in the depth direction Z, separate from the FPs 19. The channel stopper electrode 20 is in contact with and electrically connected to the n-type channel stopper region 18 via a contact hole in the field oxide film 8b.

The polyimide protective film 21 is provided in substantially an entire area of the edge termination region 42 and covers the FPs 19 and the channel stopper electrode 20. The polyimide protective film 21 extends from the edge termination region 42 to the intermediate region 43, covering ends of the front electrode 9. The dummy pattern polyimide films 22 are selectively provided on the front electrode 9, in regions of the IGBT regions 31 excluding the overlap regions 33. A back electrode 15 is provided in an entire area of the back surface of the semiconductor substrate 10, in contact with and electrically connected to the p+-type collector regions 11 and the n+-type cathode regions 12. The back electrode 15 serves as a collector electrode and a cathode electrode.

Figure 3:
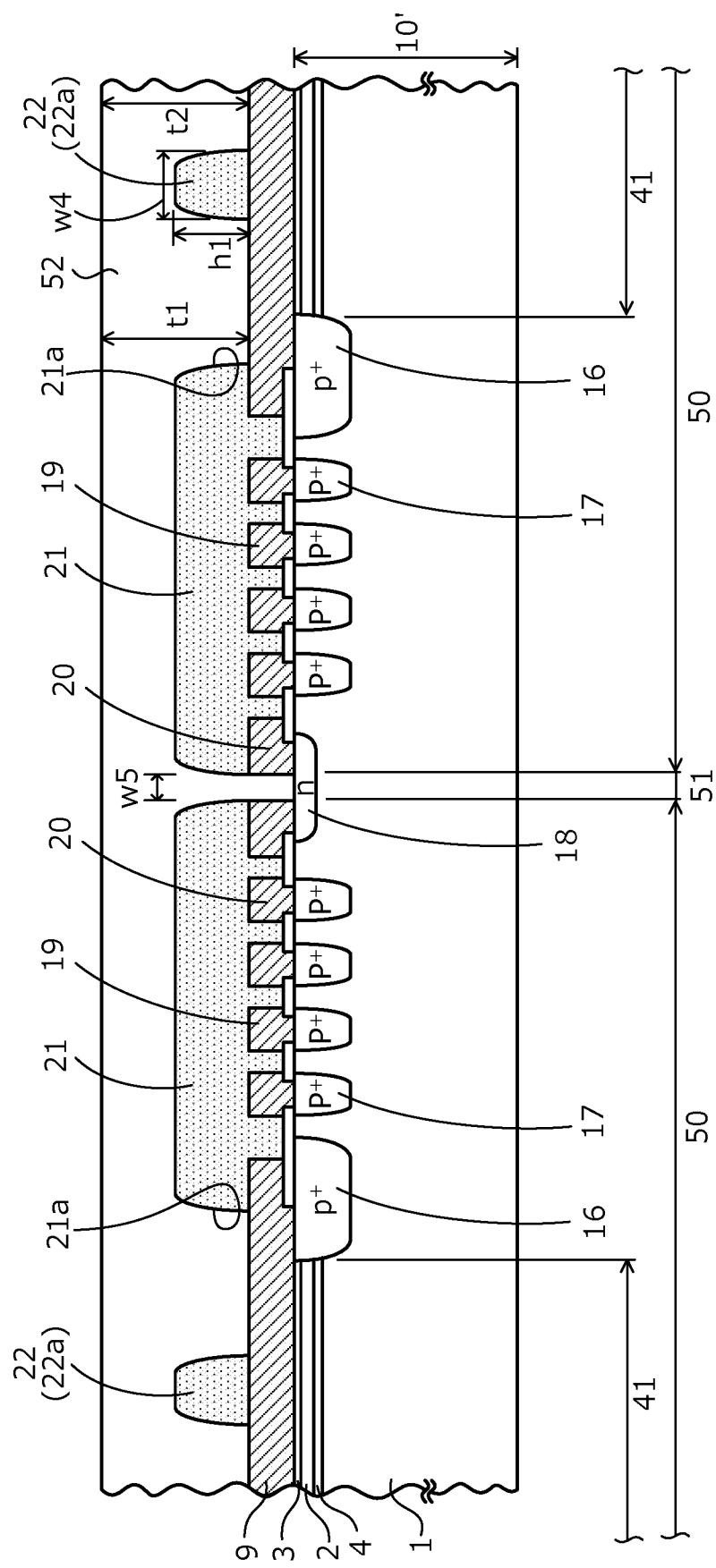
FIG. 3 is a cross-sectional view of a state of the semiconductor device according to the first embodiment during manufacture.
Figure 4:
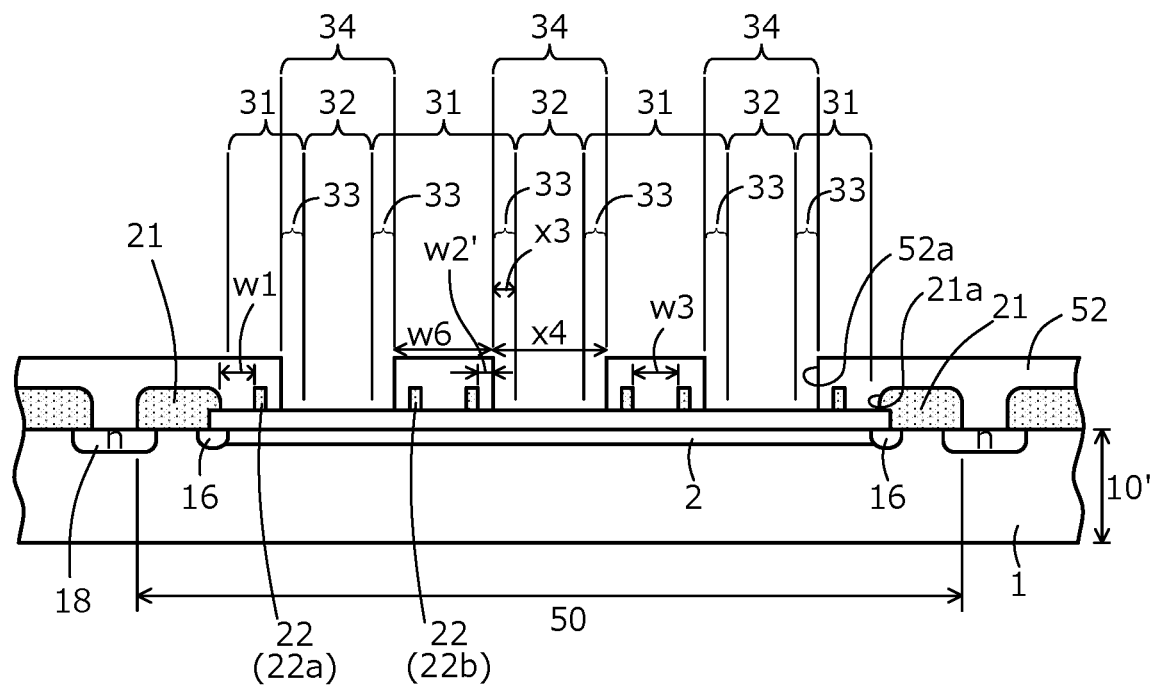
FIG. 4 is a cross-sectional view of a state of the semiconductor device according to the first embodiment during manufacture.
Figure 5:
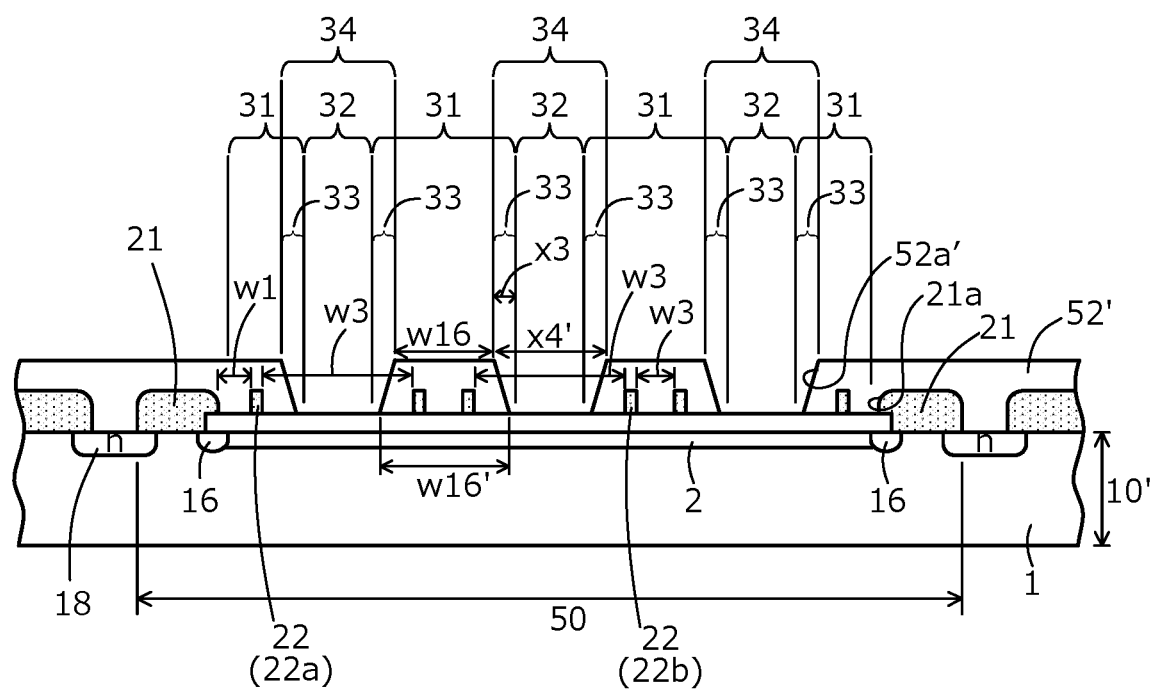
FIG. 5 is a cross-sectional view depicting another example of a state of the semiconductor device according to the first embodiment during manufacture.

Next, a method of manufacturing the semiconductor device 40 according to the first embodiment is described taking an instance of fabricating 1200V RC-IGBT as an example. FIGS. 3 and 4 are cross-sectional views of states of the semiconductor device according to the first embodiment during manufacture. FIG. 5 is a cross-sectional view depicting another example of a state of the semiconductor device according to the first embodiment during manufacture. FIGS. 3 to 5 depict states after formation of the resist film 52 used as a shielding film during the helium irradiation. FIG. 3 depicts an area near a dicing region 51 of a semiconductor wafer 10'.

FIGS. 4 and 5 depict one of multiple chip regions 50 provided in the semiconductor wafer 10', each becoming the semiconductor substrate 10 (refer to FIG. 1) when cut from the semiconductor wafer 10'. In FIGS. 3 to 5, the $n^+$-type emitter regions 3, the $p^+$-type contact regions, trench gate structure, the interlayer insulating film 8a, the field oxide film 8b, and parts of a back side of the semiconductor wafer 10' are not depicted. Further, in FIGS. 4 and 5, the n-type carrier storage regions 4 and the voltage withstanding structures of the edge termination region 42 are not depicted. Refer to FIGS. 1 and 2 regarding the parts not depicted in FIGS. 3 to 5.

First, the semiconductor wafer 10' of an $n^-$-type, constituting the $n^-$-type drift region 1 and having high resistivity is prepared. A front surface of the semiconductor wafer 10' may be, for example, a (001)-plane. A thickness of the semiconductor wafer 10' (thickness before later-described back-grinding) may be, for example, 725 μm. Next, a process including photolithography and ion implantation as one set is repeatedly performed under different conditions, thereby forming the p-type base regions 2 and the n-type carrier storage regions 4 in an entire area of the active region 41 of each of the chip regions 50 of the semiconductor wafer 10'.

Next, the front surface of the semiconductor wafer 10' is thermally oxidized, thereby forming the field oxide film 8b covering the front surface of the semiconductor wafer 10' in the edge termination region. Next, the trenches 5 that penetrate through the p-type base regions 2 and the n-type carrier storage regions 4 and reach the $n^-$-type drift region 1 are formed in the IGBT regions 31 by photolithography and etching. Next, for example, along inner walls of the trenches 5, the gate insulating films 6 are formed by thermal oxidation, and a polysilicon (poly-Si) layer is embedded in the trenches 5, thereby forming the gate electrodes 7.

Next, a process including photolithography and ion implantation as one set is repeatedly performed under different conditions, thereby selectively forming the $n^+$-type emitter regions 3 and the $p^+$-type contact regions in the IGBT regions 31 of the active region 41 of each of the chip regions 50 of the semiconductor wafer 10'. Further, in the intermediate region 43 of each of the chip regions 50 of the semiconductor wafer 10', the $p^+$-type well region 16 is selectively formed. In the FWD regions 32 of each of the chip regions 50 of the semiconductor wafer 10', the FLRs 17 and the n-type channel stopper region 18 are selectively formed.

Next, on the front surface of the semiconductor wafer 10', the interlayer insulating film 8a is formed and thereafter, the interlayer insulating film 8a is selectively removed, leaving only portions thereof covering the gate electrodes 7, whereby contact holes exposing the $n^+$-type emitter regions 3 and the $p^+$-type contact regions are formed in the active region 41. At this time, when the contact holes are formed in the active region 41, the field oxide film 8b and the gate insulating films 6 are selectively removed, thereby forming, in the edge termination region 42, contact holes respectively exposing the FLRs 17 and the n-type channel stopper region 18.

Next, on the front surface of the semiconductor wafer 10', a metal electrode is formed so as to be embedded in the contact holes, the metal electrode being patterned, leaving portions thereof constituting the front electrode 9, the FPs 19, and the channel stopper electrode 20. At this time, concurrently with the front electrode 9, electrode layers provided at a same level-layer as the front electrode 9 (for example, the gate pad of the IGBT, the electrode pad for current sensing, and the electrode pad for temperature sensing, etc.) may be formed. Next, the semiconductor wafer 10' is ground from a back surface thereof (back-grinding), to a position corresponding to a product thickness.

Next, a process including photolithography and ion implantation as one set is repeatedly performed under different conditions, thereby forming the $n^+$-type cathode regions 12 and the n-type FS region 13 spanning an entire area of each of the chip regions 50 from the active region 41 thereof, at different depths from the back surface of the semiconductor wafer 10'. Next, the $p^+$-type collector regions 11 are formed by changing portions of the $n^+$-type cathode regions 12 corresponding to the IGBT regions 31 to a $p^+$-type by photolithography and ion implantation of a p-type impurity (first process).

Next, as depicted in FIGS. 3 and 4, in the edge termination region 42, the polyimide protective film 21 constituting a passivation protective film, and the dummy pattern of the dummy pattern polyimide films 22 (22a, 22b) are formed on the front surface of the semiconductor wafer 10' (second and third processes). The dummy pattern of the dummy pattern polyimide films 22 is formed on the front electrode 9, in regions of the IGBT regions 31 excluding the overlap regions 33, under the conditions of the distances w1 to w3. The polyimide protective film 21 and the dummy pattern polyimide films 22, for example, may be a non-photosensitive polyimide film.

The polyimide protective film 21 and the dummy pattern polyimide films 22 may be formed concurrently. In this instance, for example, a polyimide film applied to an entire area of the front surface of the semiconductor wafer 10' is selectively removed by wet etching, leaving portions thereof constituting the polyimide protective film 21 and the dummy pattern polyimide films 22. Use of wet etching in selectively removing the polyimide film enables an extent of damage to the metal electrode on the front surface of the semiconductor wafer 10' to be suppressed. A shape of the dummy pattern polyimide films 22 in a cross-sectional view thereof may be substantially rectangular or may be a trapezoidal shape that narrows with increasing distance from the front surface of the semiconductor wafer 10' (not depicted).

In regions of the IGBT regions 31 excluding the overlap regions 33, the dummy pattern of the material films of the predetermined height h1 suffices to be formed on the front electrode 9, under the conditions for the distances w1 to w3 described above and instead of the dummy pattern polyimide films 22, a dummy pattern of another material or another composition may be formed. For example, instead of the dummy pattern polyimide films 22, a metal such as aluminum, a resist film of a composition different from that of the resist film 52 constituting the later-described shielding film, or a polyimide film of a composition different from that of the polyimide protective film 21 may be formed.

The polyimide protective film 21, for example, is not formed in the dicing region 51 where a dicing line is formed. The dicing region 51 is a region not used as the semiconductor substrate 10, between adjacent chip regions 50 of the semiconductor wafer 10'. A width w5 of the dicing region 51 is, for example, about 100 μm. In FIGS. 3 and 4, while the n-type channel stopper region 18 is formed in the dicing region 51, the dicing region 51 is region that is diced and removed and therefore, impurity diffused regions need not be formed in the dicing region 51.

Next, the resist film 52 opened at portions facing the overlap regions 33 of the IGBT regions 31 and the FWD regions 32 is formed on the front surface of the semiconductor wafer 10' (fourth process). The dummy pattern of the dummy pattern polyimide films 22 (22a, 22b) is formed as described above in regions of the IGBT regions 31 excluding the overlap regions 33, whereby pattern intervals of polyimide films (a pattern interval between the polyimide protective film 21 and the dummy pattern polyimide films 22, a pattern interval between the dummy pattern polyimide films 22 adjacent to one another) is narrow.

A pattern of the passivation protective films is what increases a height of the steps of the surface of the semiconductor wafer 10' the greatest. In a conventional method (refer to FIG. 11), the polyimide protective film 121 functioning as a passivation protective film is provided only in an outer periphery of chip regions 150 so as to surround a periphery of the active region 141. Therefore, while the thicknesses t101, t103 of the resist film 161 near the polyimide protective film 121 do not substantially change, the thickness t102 decreases with increasing distance inward (toward centers of the chip regions 50), from the polyimide protective film 121.

In particular, a differential thickness t104 of the thickness t102 of a portion of the resist film 161 apart from the polyimide protective film 121 by the distance w101 of about 1 mm, on an inner peripheral side of the polyimide protective film 121, and the thicknesses t101, t103 near the polyimide protective film 121 is about 5 μm. When the distance w101 from the polyimide protective film 121 exceeds 1 mm, the thickness of the resist film 161 is reduced by the difference t104 of the thickness t101 near the polyimide protective film 121 and the thickness t102 of a portion toward the center from the polyimide protective film 121 and is maintained in this state, whereby the surface becomes substantially flat.

Accordingly, to make the thickness t102 of a portion of the resist film 161 (the a portion on an inner peripheral side of the polyimide protective film 121, apart from the polyimide protective film 121 by the distance w101 of 1 mm) a thickness of, for example, 42 μm, enabling the resist film 161 to function as a shielding film, the thickness t101 of the resist film 161 near the polyimide protective film 121 has to be at least 47 μm in the helium irradiation, as described hereinafter. Therefore, to thickly form the resist film 161, the resist material has to be changed and design changes such as increasing the amount of resist used are necessary, leading to increased cost.

On the other hand, in the first embodiment, the dummy pattern of the dummy pattern polyimide films 22 is disposed in the active region 41 under the conditions of the distances w1 to w3 described above, whereby in the active region 41, portions where a step generated at the front surface of the semiconductor substrate 10 due to front surface device element structures (step of the front surface of the semiconductor substrate 10) is high may be increased. As a result, at the surface of the semiconductor wafer 10', the resist film 52 may be set to have a substantially uniform thickness, enabling the resist film 52 to function as a shielding film irrespective of the distance thereof from the polyimide protective film 21.

A shape of the resist film 52 in a cross-sectional view thereof, for example, is substantially rectangular, covering only regions of the IGBT regions 31 excluding the overlap regions 33 (FIG. 4). In this instance, a shape of contact holes 52a of the resist film 52 in a cross-sectional view thereof, for example, is substantially rectangular. An opening width x4 of the contact holes 52a of the resist film 52 is less than 1 mm. In the contact holes 52a of the resist film 52, the overlap regions 33 of the IGBT regions 31 and the FWD regions 32 are exposed. In the later-described helium irradiation, an impurity amount of the impurity defects 14 induced in the overlap regions 33 of the IGBT regions 31 and an impurity amount of the impurity defects 14 induced in the FWD regions 32 are equal.

Further, as depicted in FIG. 5, a shape of a resist film 52' in a cross-sectional view thereof may be a substantially trapezoidal shape in which portions thereof covering the overlap regions 33 has a thinner thickness than a thickness of a portion covering a region of the IGBT regions 31 excluding the overlap regions 33. In this instance, a width w16 of a top surface (top side) of the resist film 52' (FIG. 5) suffices to be set under a same condition of a width w6 of the resist film 52 having a substantially rectangular shape in a cross-section view thereof described above (FIG. 4). For example, in an instance in which the width w16 of the top surface of the resist film 52' is about 10 μm, a width w16' of a bottom surface (bottom side: surface in contact with the front electrode 9) of the resist film 52' may be about 30 μm. More preferably, in an instance in which the width w16 of the top surface of the resist film 52' is about 10 μm, the width w16' of the bottom surface of the resist film 52' suffices to be at most about 20 μm.

A shape of the contact holes 52a' of the resist film 52' in a cross-sectional view thereof is a substantially trapezoidal shape having an opening width that gradually widens with increasing distance from the front surface of the semiconductor wafer 10'. The contact holes 52a' of the resist film 52' each have a width x4' of less than 1 mm on an upper side thereof. In the contact holes 52a' of the resist film 52', only the FWD regions 32 are exposed. As described above, the resist film 52' is thinner at portions thereof covering the overlap regions 33 of the IGBT regions 31 and therefore, in the later-described helium irradiation, the impurity defects 14 are further induced in the overlap regions 33 of the IGBT regions 31 by an impurity amount less than that of the FWD regions 32.

Spreading of the resist may be performed to improve spreading of the resist between the polyimide protective film 21 and the dummy pattern polyimide films 22 adjacent thereto, and between the dummy pattern polyimide films 22 adjacent to one another may be improved by adjusting the viscosity of the resist material of the resist films 52, 52' and performing a prewet process of wetting an entire area of the front surface of the semiconductor wafer 10' with a solvent such as a thinner, after formation of the dummy pattern polyimide films 22 but before formation of the resist films 52, 52'. The resist may be applied so that the resist film constituting the resist films 52, 52' has two stacked layers.

Next, the helium irradiation is performed from the front surface of the semiconductor wafer 10', using the resist film 52 as a mask (shielding film), thereby inducing (forming) the impurity defects 14 of helium that becomes lifetime killers, in the n⁻-type drift region 1, near borders with the n-type carrier storage regions 4 (fifth process). The helium irradiation has a range that is, for example, about 15 μm from the front surface of the semiconductor wafer 10'. Thicknesses t1, t2 of the resist film 52 have to be at least about 42 μm and preferably, may be at least about 45 μm so that the resist film 52 functions as a shielding film in the helium irradiation.

The impurity defects 14 are induced by the helium irradiation, in the overlap regions 33 of the IGBT regions 31 and in the FWD regions 32 exposed in the contact holes 52a of the resist film 52, whereby the low carrier lifetime regions 34 are formed in the n⁻-type drift region 1. Regions of the IGBT regions 31 excluding the overlap regions 33 are covered by the resist film 52 and are free of the impurity defects 14. Instead of inducing the impurity defects 14 by helium irradiation, the impurity defects 14 may be induced by hydrogen ion (H⁺) irradiation.

Next, the resist film 52 is removed by an ashing process (ashing). In an instance in which the dummy pattern is formed by resist films instead of the dummy pattern polyimide films 22, the resist films forming the dummy pattern are also removed by the ashing process. The dummy pattern polyimide films 22 or metal films forming the dummy pattern instead of the dummy pattern polyimide films 22 may be left as is without being removed.

Next, the back electrode 15 is formed in an entire area of the back surface of the semiconductor wafer 10'. Thereafter, the semiconductor wafer 10' is cut (diced) into individual chips, along the dicing lines. The dicing lines, as described above, are formed in the dicing regions 51 between adjacent chip regions 50 adjacent to one another of the chip regions 50 in the semiconductor wafer 10'. The chip regions 50 of the semiconductor wafer 10' are cut and separated at the dicing regions 51, each becoming the semiconductor substrate 10, completing the semiconductor device 40 according to the first embodiment.

As described above, according to the first embodiment, on the front surface of the semiconductor wafer, other than the polyimide protective films, the dummy pattern is disposed by the dummy pattern polyimide films, whereby the pattern interval of the polyimide films on the front surface of the semiconductor wafer may be reduced. As a result, portions where the steps are high at the front surface of the semiconductor wafer may be increased, whereby at the surface of the semiconductor wafer, the resist film may be formed having a substantially uniform thickness irrespective of the distance from the polyimide protective film, thereby enabling the resist film to function as a shielding film. The dummy pattern by the dummy pattern polyimide films is disposed in regions free of the impurity defects. Therefore, a predetermined impurity may be introduced in a predetermined region with accurate positioning, using the resist film as a shielding film. Further, the resist film is formed having a substantially uniform thickness, whereby a need to make the resist film thicker than is necessary is eliminated and increases in cost may be prevented.

Next, semiconductor devices according to a second embodiment are described. FIGS. 6, 7, 8, and 9 are plan views of examples of states when the semiconductor devices according to the second embodiment are viewed from the front surface of the semiconductor substrate. In semiconductor devices 60, 60', 70, 70' according to the second embodiment, layouts of dummy patterns by respective dummy pattern polyimide films 61, 62, 71, 72 differ from that of the semiconductor device 40 according to the first embodiment (refer to FIG. 1). The dummy pattern polyimide films 61, 62, 71, 72 are disposed in regions of the IGBT regions 31 excluding the overlap regions 33, forming predetermined dummy patterns.

Figure 6:
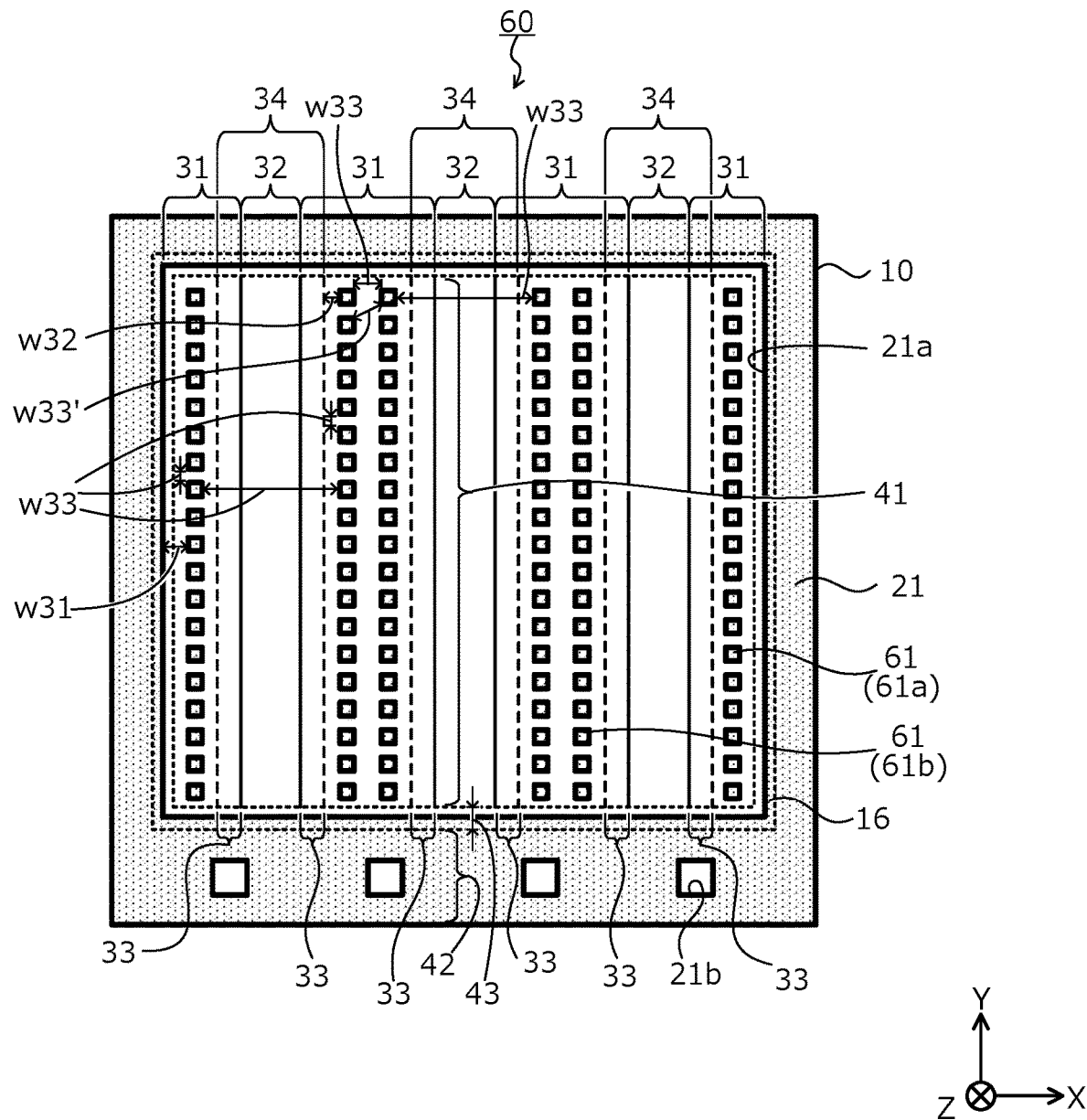
FIG. 6 is a plan view of an example of a state when a semiconductor device according to a second embodiment is viewed from the front surface of the semiconductor substrate.

In particular, the semiconductor device 60 according to the second embodiment depicted in FIG. 6 has a configuration in which dummy pattern polyimide films 61 each having a substantially rectangular shape in a plan view thereof are scattered, separate from one another, in regions of the IGBT regions 31 excluding the overlap regions 33. First polyimide films 61a are scattered at predetermined intervals on a single straight line parallel to the second direction Y, in the outermost IGBT regions 31 outermost in the first direction X. Second polyimide films 61b are scattered at predetermined intervals on at least one straight line parallel to the second direction Y, closer to the chip center than are the first polyimide films 61a.

The dummy pattern polyimide films 61 (61a, 61b) are adjacent to other dummy pattern polyimide films 61 in the first direction X. Conditions including a distance w31 between the first polyimide films 61a and the polyimide protective film 21, a distance w32 of the dummy pattern polyimide films 61 from the overlap regions 33, and a distance w33 between the dummy pattern polyimide films 61 adjacent to one another are respectively a same as the distances w1 to w3 of the first embodiment described above (refer to FIG. 1). A distance w33' between the dummy pattern polyimide films 61 adjacent to each other in an oblique direction with respect to the second direction Y is, for example, less than 1 mm.

Figure 7:
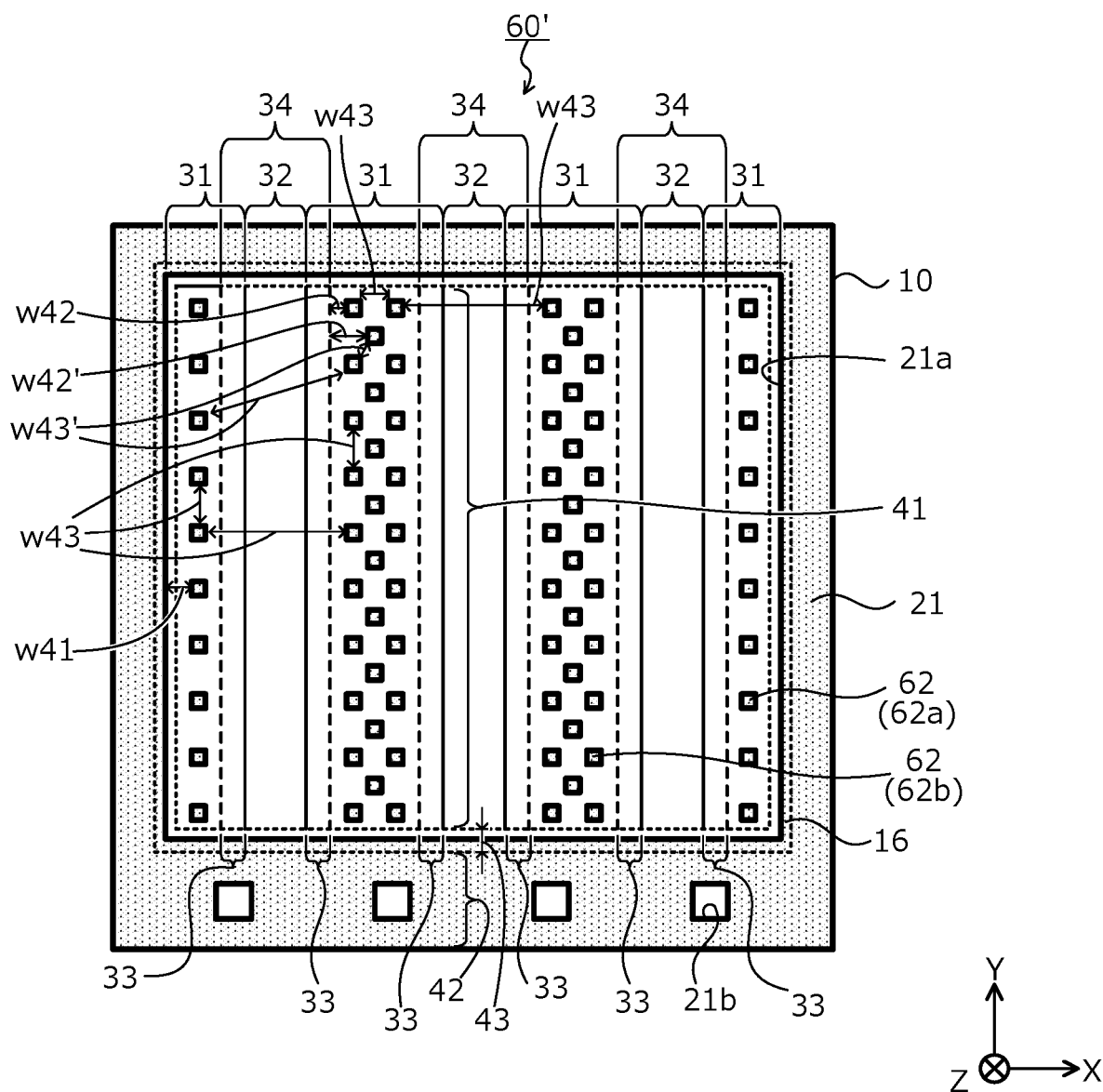
FIG. 7 is a plan view of an example of a state when a semiconductor device according to the second embodiment is viewed from the front surface of the semiconductor substrate.

A semiconductor device 60' according to the second embodiment depicted in FIG. 7 differs from the semiconductor device 60 according to the second embodiment depicted in FIG. 6 in that dummy pattern polyimide films 62 are scattered so that adjacent rows of the dummy pattern polyimide films 62 in the second direction Y are staggered by 1 dummy pattern polyimide film 62. The dummy pattern polyimide films 62 closest to each other in the second direction Y are adjacent to each other in an oblique direction with respect to the second direction Y. In the outermost IGBT regions 31 outermost in the first direction X, first polyimide films 62a may be disposed similarly to the first polyimide films 61a in FIG. 6. Reference character 62b indicates second polyimide films.

A condition of a distance w41 between the first polyimide films 62a and the polyimide protective film 21 is a same as the distance w1 of the first embodiment described above (refer to FIG. 1). Conditions including distances w42, w42' of the dummy pattern polyimide films 62 from the overlap regions 33 are a same as the distance w2 in the first embodiment described above (refer to FIG. 1). A condition of a distance w43 between the dummy pattern polyimide films 62 adjacent to another is a same as the distance w3 in the first embodiment described above (refer to FIG. 1). A distance w43' between the dummy pattern polyimide films 62 adjacent to one another in an oblique direction with respect to the second direction Y is, for example, less than 1 mm.

Figure 8:
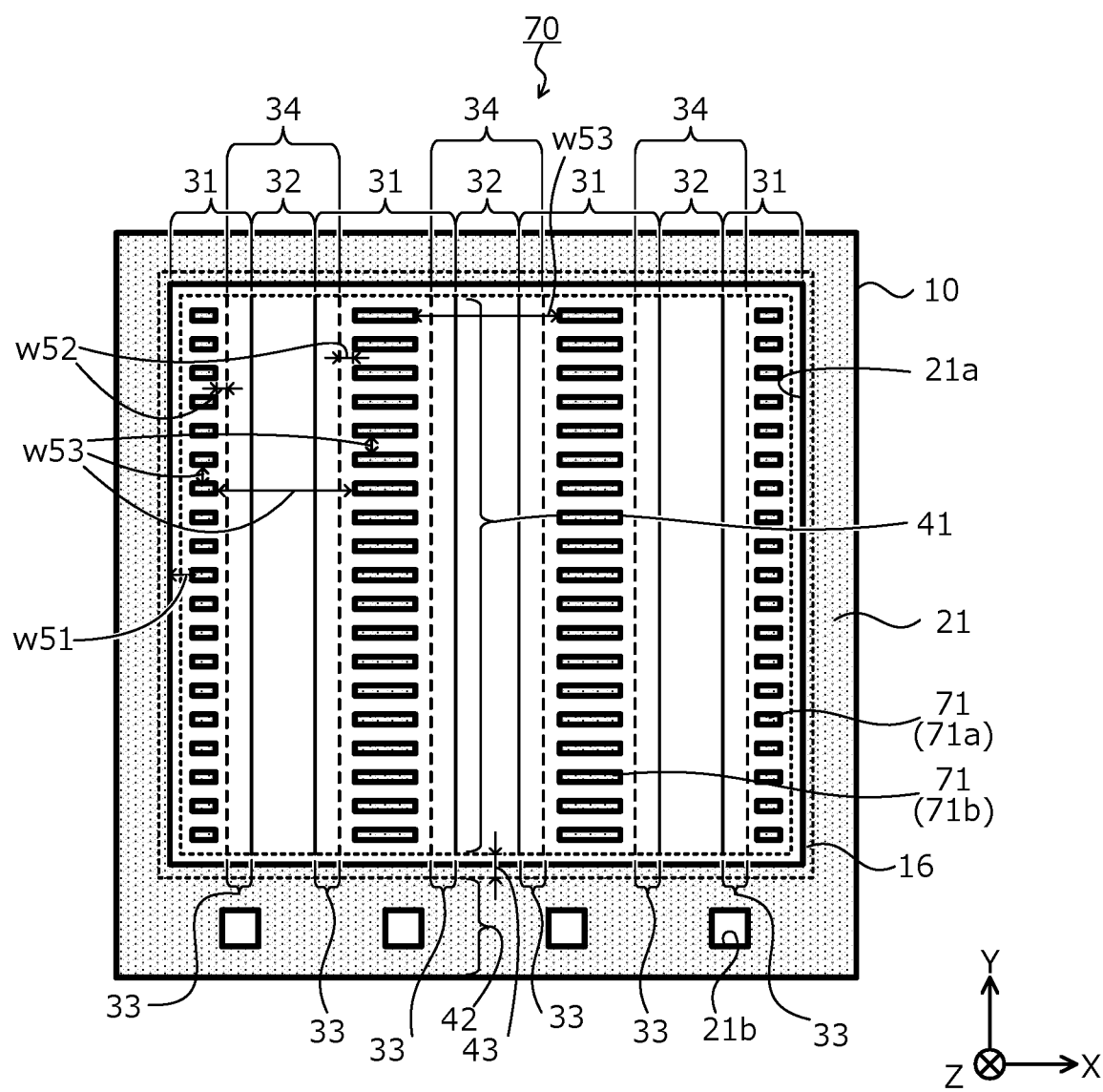
FIG. 8 is a plan view of an example of a state when a semiconductor device according to the second embodiment is viewed from the front surface of the semiconductor substrate.

A semiconductor device 70 according to the second embodiment depicted in FIG. 8 has a configuration in which multiple dummy pattern polyimide films 71, each having a linear shape extending in the first direction X, are disposed adjacent to one another in regions of the IGBT regions 31 excluding the overlap regions 33. A distance w51 between first polyimide films 71a and the polyimide protective film 21, a distance w52 of the dummy pattern polyimide films 71 from the overlap regions 33, and a distance w53 between the dummy pattern polyimide films 71 adjacent to one another are respectively a same as the distances w1 to w3 in the first embodiment described above (refer to FIG. 1). Reference character 71b indicates the second polyimide films.

Figure 9:
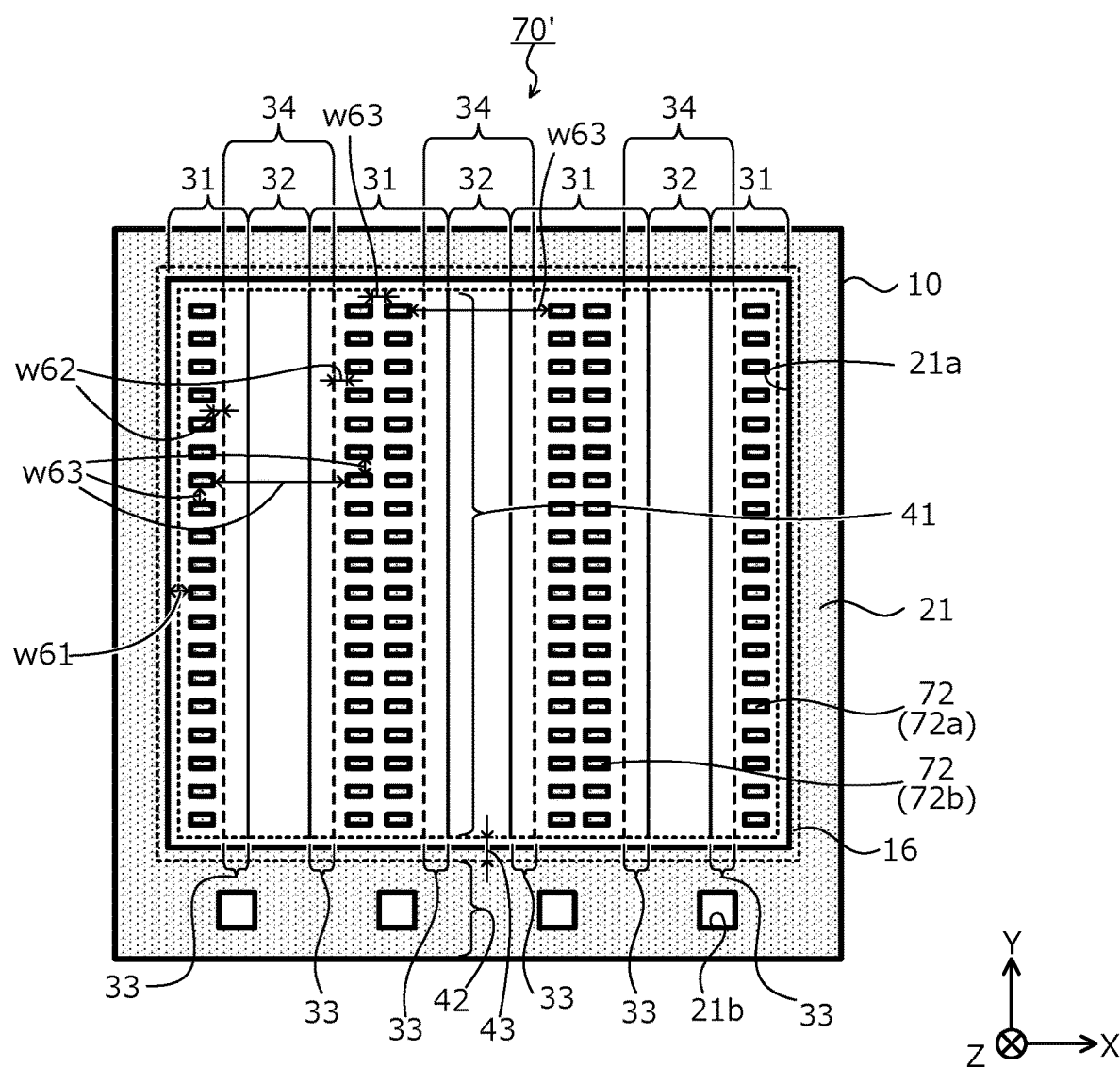
FIG. 9 is a plan view of an example of a state when a semiconductor device according to the second embodiment is viewed from the front surface of the semiconductor substrate.

A semiconductor device 70' according to the second embodiment depicted in FIG. 9 differs from the semiconductor device 70 according to the second embodiment depicted in FIG. 8 in that dummy pattern polyimide films 72, each having, in a plan view thereof, a substantially rectangular shape longer in the first direction X, are disposed parallel to the first direction X. A distance w61 between the first polyimide films 72a and the polyimide protective film 21, a distance w62 of the dummy pattern polyimide films 72 from the overlap regions 33, and a distance w63 between the dummy pattern polyimide films 72 adjacent to one another are respectively a same as the distances w1 to w3 in the first embodiment described above (refer to FIG. 1). Reference character 72b indicates the second polyimide films.

A method of manufacturing the semiconductor devices 60, 60', 70, 70' according to the second embodiment suffices to include in the method of manufacturing the semiconductor device 40 according to the first embodiment (refer to FIGS. 3 to 5), changing the layout of the dummy pattern by the dummy pattern polyimide films 61, 62, 71, 72.

As described above, according to the second embodiment, the dummy pattern polyimide films are disposed with the distance between the first polyimide films and the polyimide protective film, the distance of the dummy pattern polyimide film from the overlap regions, and the distance between the dummy pattern polyimide films adjacent to one another being set as the conditions described above, whereby effects similar to those of the first embodiment may be obtained even when the dummy pattern by the dummy pattern polyimide films is changed.

Figure 10:
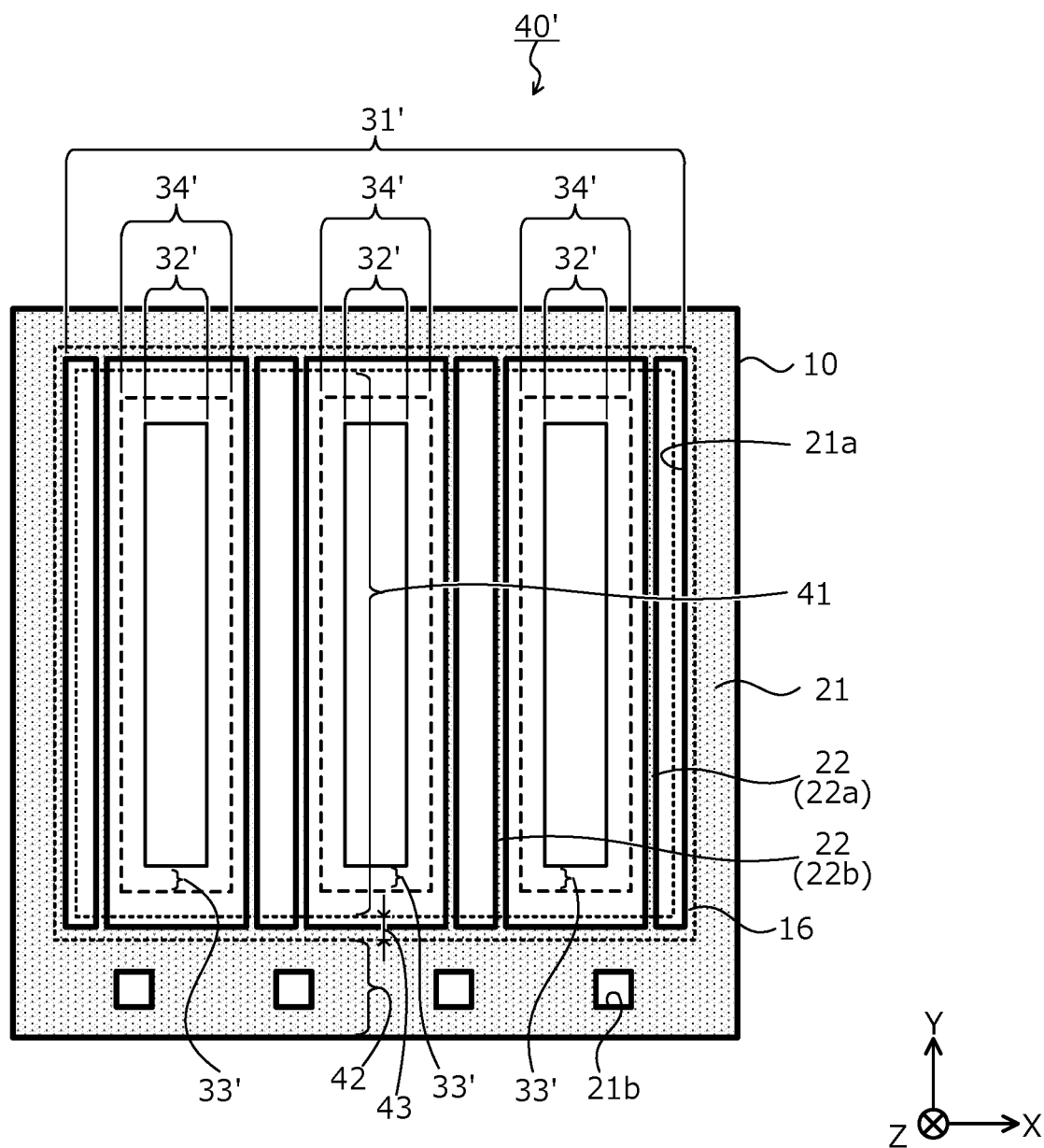
FIG. 10 is a plan view depicting one example of a state when a semiconductor device according to a third embodiment is viewed from the front surface of the semiconductor substrate.

Next, a semiconductor device according to a third embodiment is described. FIG. 10 is a plan view depicting one example of a state when the semiconductor device according to the third embodiment is viewed from the front surface of the semiconductor substrate.

A semiconductor device 40' according to the third embodiment has a layout including an IGBT region 31' and FWD regions 32' different from a layout of the semiconductor device 40 according to the first embodiment (refer to FIG. 1). In particular, in the third embodiment, in the active region 41, for example, the multiple FWD regions 32' (in FIG. 10, three (3)) each having a substantially rectangular shape longer in the second direction Y, and the single IGBT region 31' surrounding a periphery of the multiple FWD regions 32' collectively are provided. Overlap regions 33' of the IGBT region 31' respectively surround the FWD regions 32' in a substantially rectangular shape.

Similarly to the first embodiment, the dummy pattern of the dummy pattern polyimide films 22 are disposed in regions of the IGBT region 31' excluding the overlap regions 33'. Low carrier lifetime regions 34' are regions having a substantially rectangular shape longer in the second direction Y, formed by the overlap regions 33' of the IGBT region 31' and the FWD regions 32'. A periphery of the low carrier lifetime regions 34' is surrounded by a region of the IGBT region 31' free of the impurity defects 14 (refer to FIG. 2).

The third embodiment may be applied to the semiconductor devices 60, 60', 70, 70' according to the second embodiment, thereby changing the layout thereof to that of the IGBT region 31' and the FWD regions 32'.

A method of manufacturing the semiconductor device 40' according to the third embodiment suffices to include disposing the IGBT region 31' and the FWD regions 32', and changing an arrangement of the regions (the low carrier lifetime regions 34') induced with the impurity defects 14, in the semiconductor device according to the first embodiment.

As described above, according to the third embodiment, even when the arrangement of the IGBT regions and the FWD regions is changed, the dummy pattern of the dummy pattern polyimide films is disposed in regions of the IGBT regions excluding the overlap regions, whereby effects similar to those of the first embodiment may be obtained.

In the foregoing, without limitation to the embodiments described above, various modifications within a range not departing from the spirit of the invention are possible.

According to the invention described above, pattern intervals due to the protective films and material films on the front surface of the semiconductor wafer (semiconductor substrate) may be made smaller. As a result, portions where the steps of the front surface of the semiconductor wafer are high may be increased and at the surface of the semiconductor wafer, the resist film may be formed having a substantially uniform thickness irrespective of the distance from the polyimide protective film, thereby enabling the resist film to function as a shielding film.

The semiconductor device and the method of manufacturing a semiconductor device according to the present invention achieve an effect in that a predetermined impurity may be introduced in a predetermined region with accurate positioning using the resist film as a shielding film and increases in cost may be prevented.

As described above, the semiconductor device and the method of manufacturing a semiconductor device according to the present invention are useful for power semiconductor devices used in power converting equipment, power supply devices such as those of various types of industrial machines, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device, the method comprising:
    preparing a semiconductor substrate having a main surface, and forming a device element structure on the main surface;
    forming a protective film on the main surface of the semiconductor substrate to protect the device element structure, the protective film having an opening therein;
    forming at least one material film in a predetermined pattern on the main surface of the semiconductor substrate and in the opening of the protective film, the at least one material film and the protective film being separate from each other by a distance of less than 1 mm;
    forming a resist film on the main surface of the semiconductor substrate, covering the protective film, and completely covering the at least one material film in such a manner that the at least one material film is within the resist film in a top view of the semiconductor substrate, the resist film having an opening therein corresponding to an inducing region for impurity defects; and
    inducing the impurity defects in the semiconductor substrate with both the resist film and the at least one material film on the main surface of the semiconductor substrate, the resist film, but not the at least one material film, being a mask.

2. The method according to claim 1, wherein
    the at least one material film includes a plurality of material films, and
    forming the at least one material film includes disposing the plurality of material films, with an interval of less than 1 mm between any adjacent two of the plurality of material films.

3. The method according to claim 1, wherein
forming the resist film includes forming the resist film so that a distance from the at least one material film to an end of the resist film covering the at least one material film is at least 20 μm but less than 1 mm.

4. The method according to claim 1, wherein
forming the at least one material film includes forming the at least one material film, such that a height of the at least one material film is at least a half of a height of the protective film but not more than the height of the protective film.

5. The method according to claim 1, wherein
forming the at least one material film includes forming the at least one material film in a linear shape extending in a direction parallel to the main surface of the semiconductor substrate.

6. The method according to claim 1, wherein
forming the at least one material film and forming the protective film are performed concurrently, and the at least one material film and the protective film are formed using a same material.

7. The method according to claim 1, wherein
the protective film is a polyimide film.

8. The method according to claim 1, wherein
forming the device element structure includes
   forming an insulated-gate bipolar transistor, in a first region of an active region of the semiconductor substrate, and
   forming a diode connected in antiparallel to the insulated-gate bipolar transistor, in a second region of the active region that is different from the first region,
forming the protective film includes forming the protective film exposing the active region in the opening thereof,
forming the at least one material film includes forming the at least one material film in the first region, in the opening of the protective film, and
inducing the impurity defects includes inducing the impurity defects in an entire area of the second region, using the resist film as a mask.

9. The method according to claim 8, wherein
inducing the impurity defects further includes inducing the impurity defects in a portion of the first region at a border between the first region and the second region, using the resist film as the mask.

* * * * *